US008828852B2

(12) United States Patent
Hoenk et al.

(10) Patent No.: US 8,828,852 B2
(45) Date of Patent: Sep. 9, 2014

(54) DELTA-DOPING AT WAFER LEVEL FOR HIGH THROUGHPUT, HIGH YIELD FABRICATION OF SILICON IMAGING ARRAYS

(75) Inventors: Michael E. Hoenk, Valencia, CA (US);
Shoulch Nikzad, Valencia, CA (US);
Todd J. Jones, Altadena, CA (US);
Frank Greer, Pasadena, CA (US);
Alexander G. Carver, North Hollywood, CA (US)

(73) Assignee: California Institute of Technology, Pasadena, CA (US)

( * ) Notice: Subject to any disclaimer, the term of this patent is extended or adjusted under 35 U.S.C. 154(b) by 483 days.

(21) Appl. No.: 12/965,790

(22) Filed: Dec. 10, 2010

(65) Prior Publication Data

US 2011/0140246 A1 Jun. 16, 2011

Related U.S. Application Data

(60) Provisional application No. 61/285,288, filed on Dec. 10, 2009, provisional application No. 61/303,551, filed on Feb. 11, 2010.

(51) Int. Cl.
*H01L 21/20* (2006.01)
*H01L 21/36* (2006.01)

(52) U.S. Cl.
USPC .................................. 438/481; 257/E21.109

(58) Field of Classification Search
USPC ................. 438/471, 795, 716, 478, 475, 481;
257/E21.109
See application file for complete search history.

(56) References Cited

U.S. PATENT DOCUMENTS

| 6,905,965 B2* | 6/2005 | Subrahmanyan et al. ..... 438/687 |
| 2005/0255667 A1* | 11/2005 | Arghavani et al. ............ 438/405 |
| 2006/0060141 A1* | 3/2006 | Kamaishi et al. ............ 118/715 |
| 2007/0071894 A1* | 3/2007 | Mieno ........................ 427/248.1 |
| 2008/0138917 A1* | 6/2008 | Verhaverbeke et al. ......... 438/16 |
| 2008/0289650 A1* | 11/2008 | Arena ............................ 134/1.2 |
| 2010/0075508 A1* | 3/2010 | Seino et al. .................... 438/778 |
| 2011/0136288 A1* | 6/2011 | Duane et al. .................... 438/59 |

* cited by examiner

*Primary Examiner* — Daniel Luke
*Assistant Examiner* — Latanya N Crawford
(74) *Attorney, Agent, or Firm* — Milstein Zhang & Wu LLC; Joseph B. Milstein

(57) ABSTRACT

Systems and methods for producing high quantum efficiency silicon devices. A silicon MBE has a preparation chamber that provides for cleaning silicon surfaces using an oxygen plasma to remove impurities and a gaseous (dry) $NH_3+NF_3$ room temperature oxide removal process that leaves the silicon surface hydrogen terminated. Silicon wafers up to 8 inches in diameter have devices that can be fabricated using the cleaning procedures and MBE processing, including delta doping.

19 Claims, 19 Drawing Sheets

Delta-doped 2k x 4k

1602

1604

1606

1608

1610

1612

DELTA-DOPING AT WAFER LEVEL FOR HIGH THROUGHPUT, HIGH YIELD FABRICATION OF SILICON IMAGING ARRAYS

CROSS-REFERENCE TO RELATED APPLICATIONS

This application claims priority to and the benefit of co-pending U.S. provisional patent application Ser. No. 61/285,288, filed Dec. 10, 2009, and of co-pending U.S. provisional patent application Ser. No. 61/303,551, filed Feb. 11, 2010, each of which applications is incorporated herein by reference in its entirety. This application is also related to U.S. Pat. Nos. 4,798,598, 4,822,748, 4,882,609, 5,316,586, 5,376,810, 5,701,016, 6,403,963, 7,786,421 and 7,800,040, each of which patents is incorporated herein by reference in its entirety, and all of which are commonly assigned to the assignee of the present application.

STATEMENT REGARDING FEDERALLY FUNDED RESEARCH OR DEVELOPMENT

The invention described herein was made in the performance of work under a NASA contract, and is subject to the provisions of Public Law 96-517 (35 USC 202) in which the Contractor has elected to retain title.

FIELD OF THE INVENTION

The invention relates to systems and methods for processing semiconductors in general and particularly to systems and methods that employ dry processing.

BACKGROUND OF THE INVENTION

Solid state imaging detectors, such as charge-coupled devices and CMOS imaging detectors, are conventionally illuminated through the front surface. In this configuration, structures designed for circuit operation (including patterned oxides, polysilicon electrodes, and metal interconnects) cause reduction of quantum efficiency and loss of resolution by absorption and scattering of incident light. Soon after the invention of charge-coupled devices, a back-illuminated CCD was demonstrated, in which light the imaging detector is flipped upside down and illuminated from the opposite side of the silicon wafer. Back-illumination typically requires removal of the low-resistivity substrate and passivation of the exposed silicon surface. In the case of high resistivity substrates, substrate removal is not required, but substrate thinning and surface passivation are still required to achieve high, stable quantum efficiency across a broad spectral range. Various technologies for thinning are described in the literature.

Surface passivation has been a critical part of silicon device development from the beginning. The first successful demonstration of amplification with a solid-state transistor closely followed John Bardeen's seminal paper on the role of surface charge and rectification at the semiconductor surface, and the development of integrated circuits in the 1960's was enabled by the discovery of technologies for surface passivation with thermal oxides. Virtually all semiconductor devices—including especially solid-state imaging devices—depend for their performance and stability on surface passivation processes. Since the first demonstration of silicon CCDs in 1969, many of the key advances in device performance have been related to the passivation of the Si—$SiO_2$ surface, including especially the front-side developments of buried channel devices, and surface inversion during charge integration (also known as multi-pinned phase, or MPP). Back-illuminated detectors were demonstrated as early as 1974, but the performance of these early back-illuminated devices suffered from the lack of an adequate surface passivation technology. The significance of this problem was realized by NASA in the aftermath of the 1984 discovery of quantum efficiency hysteresis in CCDs built into the Hubble Space Telescope's Wide Field/Planetary Camera (WF/PC). Instabilities related to surface traps and poor passivation plagued WF/PC practically up to the 1992 launch of WF/PC II, in which back-illumination was abandoned in favor of phosphor-coated, front-illuminated CCDs.

JPL developed delta-doping in 1992 as a method and device for achieving stable, high ultraviolet quantum efficiency in silicon CCDs (U.S. Pat. No. 5,376,810, Dec. 27, 1994). Initial MBE growths at JPL in 1991 used MBE to grow 5 nm of uniformly boron-doped silicon, as described in Michael E. Hoenk, Paula J. Grunthaner, Frank J. Grunthaner, R. W. Terhune, and Masoud Fattahi, "Epitaxial growth of p+ silicon on a backside-thinned CCD for enhanced UV response," Proc. SPIE 1656, 488 (1992). In all subsequent growths on CCDs and other imaging detectors, JPL used MBE to grow delta-doped silicon layers for surface passivation, as described in Michael E. Hoenk, Paula J. Grunthaner, Frank J. Grunthaner, R. W. Terhune, Masoud Fattahi, and Hsin-Fu Tseng, "Growth of a delta-doped silicon layer by molecular beam epitaxy on a charge-coupled device for reflection-limited ultraviolet quantum efficiency," Appl. Phys. Lett. 61, 1084 (1992). This approach used highly doped silicon to create a strong near-surface electric field and eliminate the back surface potential well, thus passivating the silicon surface and achieving the desired high quantum efficiency and stability. The development of low-temperature MBE processes at JPL in the 1980's was an important technology for the implementation of MBE-growth as a surface passivation technology for CCDs.

There is a need for systems and methods that can provide silicon devices having improved passivation of surfaces and interfaces (especially over large area devices and/or wafers), in order to provide improvement of operating parameters (such as improved stability, reduced leakage and/or dark current, and improved efficiency), and/or improved manufacturing parameters (such as yield and throughput).

SUMMARY OF THE INVENTION

According to one aspect the invention features a method and apparatus for implementing surface passivation by quantum exclusion, in which subnanometer-scale control over surface structures and materials produces a buried electronic surface that isolates the physical surface from the bulk semiconductor material, and prevents the interaction of minority carriers with surface defects.

According to one aspect, surface passivation by quantum exclusion stabilizes the electronic properties of silicon surfaces and interfaces without requiring low defect densities at the interface.

According to one aspect, surface passivation by quantum exclusion stabilizes the electronic properties of silicon surfaces and interfaces without exposing the surface to process temperatures greater than 600° C.

According to one aspect, the invention features a silicon device. The device comprises a silicon wafer having the device fabricated on a first surface thereof, and having a second surface; the silicon wafer having an abrupt doping profile situated adjacent at least one of the first surface and the second surface, the abrupt profile having a dopant concentration at least $10^{20}$ cm$^{-3}$ and a dopant gradient at least one decade per nm; the silicon wafer having at least one of the first surface and the second surface electronically passivated irrespective of a density of defects present on the respective one of first surface and the second surface. The term "electronically passivated" is defined to mean that charge carriers approaching a surface from the bulk beyond the abrupt doping profile have a reduced likelihood of being recombined at defects on the surface as compared to a surface of a silicon material lacking the abrupt profile.

In one embodiment, the abrupt profile has a dopant concentration at least $10^{21}$ cm$^{-3}$ and a dopant gradient at least one decade per nm.

In another embodiment, the silicon device comprises a surface cleaned in a two step gaseous cleaning process.

In yet another embodiment, the device comprises a device selected from the group of devices consisting of a CCD device, a CMOS device, an NMOS device, a photodiode, and a silicon solar cell.

According to another aspect, the invention relates to a molecular beam epitaxy apparatus for processing a silicon material. The molecular beam epitaxy apparatus comprises an epitaxy chamber configured to perform molecular beam epitaxy on a silicon material; a preparation chamber configured to clean a surface of the silicon material of surface contaminants by an oxidizing plasma process, and configured to remove an oxide from the surface of the silicon material by formation and removal of a volatile silicate, the preparation chamber having at least one mutual communication port with the epitaxy chamber whereby the silicon material can be transferred between the epitaxy chamber and the preparation chamber; a plasma source attached to the preparation chamber, the plasma source configured to generate an oxidizing plasma; a throttle valve, a controller, and a reactive gas supply, configured to provide reagent gases to the preparation chamber; and pumping equipment configured to provide a reduced pressure within the preparation chamber.

In one embodiment, the plasma source configured to generate an oxidizing plasma is configured to generate an oxygen plasma.

In another embodiment, the preparation chamber configured to remove an oxide from the surface of the silicon material by formation and removal of a volatile silicate is configured to use $NH_3$ and $NF_3$ to generate a volatile silicate.

In yet another embodiment, the epitaxy chamber is configured to accommodate at least one silicon material having a dimension of at least 6 inches.

In still another embodiment, the epitaxy chamber is configured to accommodate at least one silicon material having a dimension of at least 8 inches.

In a further embodiment, the apparatus is configured to process the silicon material at a temperature less than or equal to 450° C.

In yet a further embodiment, the silicon material comprises a device selected from the group of devices consisting of a CCD device, a CMOS device, an NMOS device, a photodiode, and a silicon solar cell.

In one more embodiment, the silicon material comprises a delta-doped device.

In still a further embodiment, the silicon material comprises a device configured to operate under back-illumination.

According to one aspect, the invention features a silicon processing method. The silicon processing method comprises the steps of providing an MBE apparatus; providing a silicon material to processed; applying an oxidizing plasma to a surface of the silicon material; reacting an oxide present on the surface of the silicon material with reagent gases to form a silicon compound volatile at a temperature below 450° C.; and removing the silicon compound to provide a clean hydrogen-bonded silicon surface on the silicon material. The MBE apparatus comprises an epitaxy chamber configured to perform molecular beam epitaxy on a silicon material; at least one preparation chamber configured to clean a surface of the silicon material of surface contaminants by a process having an impurity removal step, and having an oxide removal step, the at least one preparation chamber having at least one mutual communication port with the epitaxy chamber whereby the silicon material can be transferred between the epitaxy chamber and the at least one preparation chamber; the at least one preparation chamber having in communication therewith a plasma source configured to generate an oxidizing plasma, at least one throttle valve, at least one controller, and at least one reactive gas supply configured to provide reagent gases to the at least one preparation chamber; and pumping equipment configured to provide a reduced pressure within the at least one preparation chamber.

In one embodiment, the silicon processing method further comprises the step of performing molecular beam epitaxy on the silicon material.

In another embodiment, the step of performing molecular beam epitaxy on the silicon material comprises performing delta doping.

In yet another embodiment, the silicon material is maintained at a temperature less than or equal to 450° C.

In still another embodiment, the silicon material comprises a device selected from the group of devices consisting of a CCD device, a CMOS device, an NMOS device, a photodiode, and a silicon solar cell.

In a further embodiment, the silicon material comprises a device configured to operate under back-illumination.

In yet a further embodiment, the at least one preparation chamber comprises two preparation chambers.

In an additional embodiment, the impurity removal step is performed in a first of the two preparation chambers and an oxide removal step is performed in a second of the two preparation chambers.

In one more embodiment, the impurity removal step and oxide removal step are repeated multiple times.

In still a further embodiment, one of the first and second preparation chambers is a glove box.

In yet another embodiment, the impurity removal step and the oxide removal step are repeated multiple times.

In one embodiment, the impurity removal step is an oxidation step.

In another embodiment, the oxidation step is performed using a gas comprising oxygen.

In yet another embodiment, the impurity comprises carbon.

In still another embodiment, the impurity removal step is a reduction step.

In a further embodiment, the reduction step is performed using a gas selected from the group consisting of $H_2$, $NH_3$, and mixtures thereof.

In yet a further embodiment, the impurity comprises carbon.

In an additional embodiment, the oxide removal step is performed using a gas selected from the group consisting of $NF_3$, $NH_3$, $N_2$, $H_2$ and mixtures thereof.

In one more embodiment, the oxide removal step is performed using a fluorine containing gas.

In still a further embodiment, the fluorine containing gas is selected from the group consisting of HF, $NF_3$, and $F_2$ and mixtures thereof.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

DETAILED DESCRIPTION

Delta Doping: Passivation of Semiconductor Surfaces by Quantum Exclusion

Growth of highly doped silicon by molecular beam epitaxy, first demonstrated at the Jet Propulsion Laboratory (JPL) in 1991, is the only surface passivation technology that eliminates quantum efficiency hysteresis in back-illuminated scientific imaging arrays. Delta-doping Tests specifically designed to characterize the stability of delta-doped detectors and to search for signs of hysteresis showed no trace of hysteretic response. Quantum exclusion both explains the exceptional performance of delta-doped CCDs, and extends the concepts and applications to existing devices, novel devices, and new applications that are relevant to NASA's conduct of aeronautical and space activities.

Figure 1:
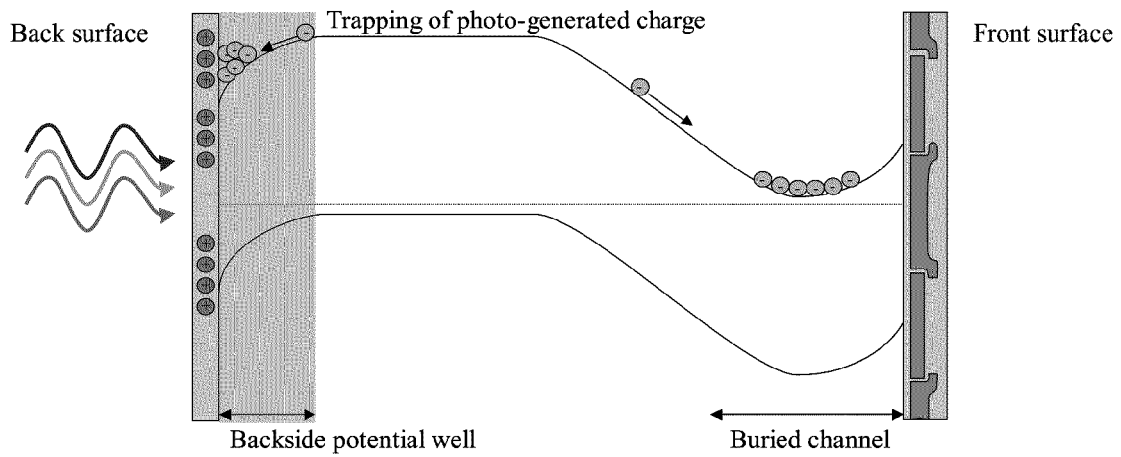
FIG. 1 is a schematic drawing of the electronic band structure in a back illuminated silicon imaging detector. The detector is depicted in cross section, with the back surface on the left and the front surface on the right. The front surface electrodes, consisting of multiple layers of oxide, polysilicon, and metal, are shown schematically on the right, and an oxide formed on the back surface is shown schematically on the left. Light enters the detector from the back surface, generating free electrons in the conduction band. In order to be detected, the electrons must move by drift and diffusion into the buried channel near the front surface. However, positive charge at the back surface creates a backside potential well, which can trap some of the photogenerated electrons.

Surfaces and interfaces in semiconductors are the source of a variety of problems in semiconductor devices. Surface/interface states can act as electronic traps and centers of recombination and generation that can have multiple deleterious effects on device performance, including dark current, noise, and instabilities in semiconductor devices, and thus present a long-standing problem in semiconductor device technology. Passivation of surfaces and interfaces mitigates these problems. One aspect of this more general problem is surface passivation in solar cells, photodiodes and back-illuminated imaging detectors. This is illustrated by FIG. 1.

In state-of-the-art devices, surface passivation is addressed by two strategies that can be used alone or in combination. For example, in silicon solar cells, the lowest reported surface recombination velocities (a measure of the effectiveness of surface passivation) are achieved using a combination of these strategies. In the first approach, defects at surfaces and interfaces are eliminated, neutralized, or otherwise electrically deactivated through chemical passivation and/or growth/deposition of a low-defect surface. Examples of this strategy include the formation of high quality $SiO_2$ layers on a silicon surface in order to minimize the surface defect density, and the chemical passivation of defects with atomic hydrogen by, for example, annealing in forming gas or ion implantation and thermal activation. Second, chemisorption and/or surface doping methods can be used to create an electric field near the semiconductor surface, in order to bias the surface into accumulation and prevent minority carriers from interacting with surface defects. A great deal of effort has gone into developing passivation layers and near-surface dopant profiles for optimal performance of solar cells, UV photodetectors, and back-illuminated imaging detectors. Examples of surface passivation technologies developed for back-illuminated imaging detectors include the UV flood, platinum flash gate, chemisorption, shallow implantation of dopants, shallow diffusion of dopants, and delta-doping.

Two of the major difficulties with the various technologies for surface passivation methods lie with the various instabilities associated with surface states and defects that affect device performance, and the susceptibility of the surface to degradation by radiation or exposure to UV radiation. Quantum efficiency hysteresis has plagued scientific solid-state imaging detectors ever since NASA first invested in charge coupled devices (CCDs) in the early 1970's. Instabilities are especially problematic in the technologically important area of deep ultraviolet photodetectors and imagers, because deep ultraviolet photons and other forms of ionizing radiation carry sufficient energy to damage the surface, altering surface charge and producing electrically active defects. Exposure to ionizing radiation is a serious problem for both field-induced passivation and doping passivation.

Here we focus on doping the surface. In general, doping the surface of an imaging detector mitigates, but does not completely eliminate, trapping of photogenerated charge at the surface. Surface charge depletes the surface to a depth that depends on the amount of charge in the oxide and the spatial distribution of ionized dopant atoms beneath the surface. Variation of the surface charge causes variation in the width of the depletion layer, which in turn causes variation in the quantum efficiency. In particular, the width of the surface depletion layer may vary under illumination. Changes to the depletion layer width may be permanent (e.g., UV-induced creation of defects at $SiO_2$—Si interface), or temporary (e.g., UV-adsorbed ions, and/or dynamic trapping of mobile charge carriers at the surface). This phenomenon, known as quantum efficiency hysteresis, is a major problem in scientific imaging detectors.

One solution involves delta-doping the surface of back-illuminated CCDs and CMOS imaging arrays to passivate the surface, and, uniquely among known surface passivation methods, completely eliminate quantum efficiency hysteresis. Delta-doping is an example of surface passivation by quantum exclusion.

We now present a quantum mechanical formulation of the problem and its solution, which provides a new explanation for the observation that delta-doped CCDs have proven impervious to the damaging effects of deep ultraviolet light and other forms of ionizing radiation. It is stipulated that the concept of surface passivation by quantum exclusion is more general both in method and application; that other methods of creating the required near-surface electronic potential can be developed based on these concepts; and that passivation by quantum exclusion may find useful application in a larger class of semiconductor devices and applications than the above-cited examples of solar cells, photodetectors, and back-illuminated solid-state imaging devices.

Quantum mechanical exclusion of minority carriers from the surface results in exceptional performance and stability of imaging detectors. Because of the relationship between wave functions and electronic potential of doped semiconductors, a strongly-peaked, near-surface doping profile creates an electronic potential that effectively excludes minority carriers from interacting with the surface. Conceptually, this results in the formation of an electronic surface that is buried beneath the physical surface, thus isolating and decoupling surface states and defects from interfering with device operation.

This decoupling of the electronic and physical surfaces is extremely important in delta-doped imaging detectors, because it prevents surface coatings, chemisorbed molecules, and external fields from affecting the stability of a delta-doped detector.

The isolation of electronic and physical surfaces by quantum exclusion is important, but this represents only part of the potential for this technology. The concepts and methods presented here can be generalized to encompass many more device structures and technologies. The epitaxial growth technology used for delta-doping surfaces, together with the theory of surface passivation by quantum exclusion, are readily extendable to more complicated structures and functions, especially with respect to two and three dimensional patterned structures. The ability to fabricate semiconductor dopant profiles with atomic-scale precision enables the manipulation of quantum mechanical states and quantum transport of electrons and holes. These technologies can thus be applied in the design, modification, and development of many conceivable device structures, seeking either optimal performance of existing devices or developing new devices and structures.

We define quantum exclusion as the effective isolation of minority carriers from the near-surface region of a semiconductor based on the probabilistic laws of quantum mechanics as applied to dopant profiles that can be precisely controlled on an atomic scale. According to quantum mechanical formalism, semiconductor structures formed on length scales comparable to the effective Bohr radius of electrons and/or holes are characterized by quantized energy states, which effectively increases the electronic band gap within such structures. It was predicted in the 1950's, and experimentally verified in the 1960's that electronic states can be quantized near semiconductor surfaces, such as for electronic states in the inversion layer of a silicon surface that was subjected to a strong electric field. Majority carriers in the inversion layer form a two-dimensional electron gas, in which the energies, density of states, and mobility are strongly influenced by quantum confinement.

Figure 2:
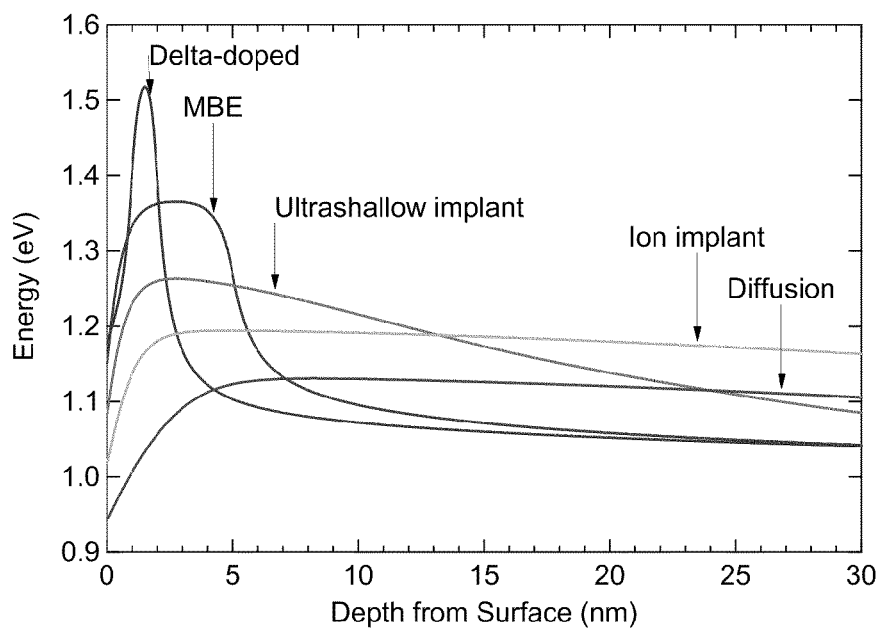
FIG. 2 is a diagram showing the near surface conduction band edge calculated for four different methods of surface doping. The potential energy is plotted in eV, and depth from the surface is given in nanometers; for comparison, the minimum 1/e absorption depth in silicon is approximately 4 nm, and thermal energy is approximately 0.015 eV at −100 C. In order to prevent trapping of UV-generated photoelectrons in the backside potential well and eliminate quantum efficiency hysteresis, a sharply peaked dopant profile is essential to creating a strong electric field within a few nm of the surface. Only delta-doping can achieve this goal.

In particular, quantum mechanical calculations of electronic states in the vicinity of a delta-doped surface explain the observed 100% internal quantum efficiency and stable response in back-illuminated, delta-doped charge coupled devices (CCDs). Delta-doping presents a unique case among surface doping technologies, in that all of the dopant atoms are concentrated at a fixed distance from the surface. Using the atomic-scale control over crystal composition made possible by molecular beam epitaxy (and to a lesser extent by some other crystal growth technologies), a sharply peaked dopant profile can be formed with precision, such that the peak is formed within a few nanometers of the silicon surface (see FIG. 2). Such a sharply-peaked dopant profile is termed delta-doping, in reference to the mathematical delta function. Delta-doped CCDs have been shown to exhibit nearly 100% internal quantum efficiency throughout the visible and ultraviolet regions of the spectrum. Furthermore, delta-doped CCDs do not exhibit quantum efficiency hysteresis even under exposure to Lyman-alpha radiation at 121.6 nm.

Delta-doped CCDs therefore offer a concrete example that surface passivation by quantum exclusion is not only possible, but practical and useful in the design of semiconductor devices. The spreading-out in space of both minority and majority carriers in semiconductors is described mathematically in probabilistic terms by wave functions. One method for calculating the wave functions, used in the literature to describe surface inversion layers in semiconductors, is to self-consistently solve the Poisson and Schrödinger equations for a specific semiconductor device structure. The quantum mechanical formalism used to describe semiconductor inversion layers, when applied to the back surface of a delta-doped CCD, shows that electronic states in the backside potential well are strongly coupled to the lower-energy conduction band states in the bulk semiconductor (see FIG. 3). In the case of delta-doping, the dopant profile, and hence the electronic potential, is so strongly peaked near the surface that the wave functions of minority carriers in the near-surface potential well cannot be fully confined to the surface region, but instead spread well into the region where the conduction band forms a continuum in energy. Under these conditions, the "surface states" are only quasi-bound, and minority carriers in these states are rapidly transported away from the surface by quantum mechanical tunneling. In effect, there are no bound states for minority carriers at the back surface, resulting in a highly effective passivation of the surface. Thus, in this technologically important example, the "backside potential well" of thinned, delta-doped, back-illuminated imaging detectors is effectively eliminated in the probabilistic sense of quantum mechanics, and trapping of electrons at the surface becomes impossible.

Surface passivation by quantum exclusion results in the effective isolation of the physical surface, where are located surface defects and traps, from the electronic surface, which is defined in space by the position of the buried delta-doped layer. In the case of delta-doping, the theory provides a quantitative means of determining how sharply peaked the dopant profile must be, how close the peak must be to the surface, and what concentration of dopant atoms must be achieved in order to achieve quantum exclusion. More importantly, the theory and concepts of quantum exclusion developed to analyze this one dimensional problem can be generalized to solve problems in two and three dimensions. For example, by combining semiconductor patterning technologies with molecular beam epitaxial growth technologies, it will be possible to engineer three dimensional "electronic surfaces and interfaces" to develop new applications and novel nanostructured devices. A number of problems having to do with surface states and defects at the front surface of semiconductor devices may be amenable to this approach. For example, surface-generated dark current currently constitutes one of the major limitations to the performance of CMOS imaging detectors. Problems such as this, in which semiconductor surfaces and interfaces introduce problems such as excessive surface-generated dark current, trapping of charge at interfaces, and so-called "spurious charge" injection, can be approached by developing two- and three-dimensional structures that use quantum exclusion to isolate surface states and defects (the physical surface) from the electronic surface and active volume of the device. Other applications of quantum exclusion may be found.

One example of practical utility involves telescopes. At the heart of every ground-based astronomical telescope and every telescope launched by NASA into space are solid state imaging detectors, which transform light into digital images with exceptional sensitivity, resolution, and dynamic range. It is no small task to achieve such precision. Light incident on the solid-state imaging array is converted into charge, which is collected over the entire array and measured with sensitivity that can approach the level of single electrons, and yet maintain exceptional photometric precision over a dynamic range covering four to five orders of magnitude. At this level of precision, defects in the detector material become extremely important. From a materials science perspective, many of the challenges currently faced by developers of scientific imaging detectors come down to controlling the surfaces and interfaces comprising the solid-state device. More generally, controlling electronic states at semiconductor surfaces and interfaces is the key to virtually all electronic devices.

Fabrication Processes

We now describe fabrication processes for devices using back illumination technology based on delta-doping, thinning, and packaging. The back illumination technology can be applied to CCD wafers available from a commercial silicon "foundry" or vendor of processed wafers. Delta doping technology when applied to a variety of CCDs and CMOS imaging arrays has enabled 100% internal quantum efficiency (QE), high stability in the QE, uniformity of response, and low dark current. It has been demonstrated that the application of this technology to CCD designs advances the state of the art as measured by such essential performance parameters as quantum efficiency (QE), spectral range, dark current, stability, uniformity, dark current, point spread function, and sensor flatness.

Important features of the technology include Delta-doped back surface passivation for 100% internal QE with exceptional stability and photometric accuracy; robust support and thinning technology for 100 micron thickness while maintaining flatness; and integrated AR coatings for optimized performance in different spectral bands.

One application is in the Large Synoptic Survey Telescope (LSST) which expected to break ground in more than wide field imaging. In particular, great attention is expected to achieve accurate knowledge of photometric precision, astrometric precision and PSF (point-spread function). Each one of these attributes is expected to directly result in major advances in astronomy (e.g. Galactic archeology, Galactic dynamics and stellar kinematics and weak lensing).

The sensor, comprising Charge Coupled Devices (CCDs), is critical to the success of LSST. Sensitivity demands the highest possible quantum efficiency over the visible bands as well as accurate knowledge of linearity and flat surfaces without intrinsic variations. Delta-doped CCDs satisfy these demanding requirements. Indeed, there is evidence that delta-doped CCDs are superior to conventional CCDs.

There is great interest in these devices for both upgrading present instruments at the Mount Palomar observatory (the venerable Double Beam Spectrograph) and the Keck Observatory (Echellete Imaging Spectrometer and a recently proposed new seeing limited Echelle Spectrograph).

An end-to-end post fabrication device processing to produce high performance silicon imaging arrays of various designs for the UV to NIR range of the spectrum is described. Nonequilibrium crystal growth techniques are used to engineer the device bandstructure to deliver maximum QE, minimized leakage and dark current, and optimum spectral range in a stable and reliable device structure.

Elements of the technology include development of n-channel p-type delta doped CCDs, extension of the CCD response for EUV and low energy particle detection, development of high-speed delta doped CCD cameras and development of delta doped p-channel LBNL CCDs. Additional features include the growth of delta-doped layers on fully processed n-channel CCDs in order to modify the interface bandstructure and achieve 100% internal QE, and growth processes for n-type delta doping for high purity p-channel CCDs with near-100% internal QE. Detector processing elements include thinning of n-channel conventional CCDs and CMOS arrays down to 5 micron and chemical mechanical polishing.

The end-to-end processes for producing back-illuminated silicon imaging arrays start from fully-fabricated devices, and use delta-doping technology to extend the spectral range of the imagers to cover the entire UV-NIR spectral range with 100% internal QE (nearly 100% DQE in UV-NIR with AR coating), and enable excellent stability, uniformity, and low dark current. This technology has been successfully demonstrated on a variety of CCDs and CMOS designs and formats. The exceptional performance of delta-doped devices has been verified by many groups, and demonstrate that delta-doped detectors provide the exceptional stability required for precision photometry.

In addition to the high performance that they enable, the processes are done at low temperature, and are therefore entirely compatible with VLSI device structures. This provides the flexibility to work with virtually any device design.

Delta doping is a technique that uses molecular beam epitaxy (MBE) to passivate a back illuminated silicon imaging array by placing a very high concentration of charge near the back surface of the imager. Delta-doped detectors have been demonstrated with 100% internal QE from the extreme UV (n-channel) through the near infrared (p-channel) with dark current of 0.5 electrons/pixel/hour (at −130° C.), and exceptional uniformity and photometric stability. Delta doping is a low temperature process that is fully compatible with VLSI fabrication.

Figure 3:
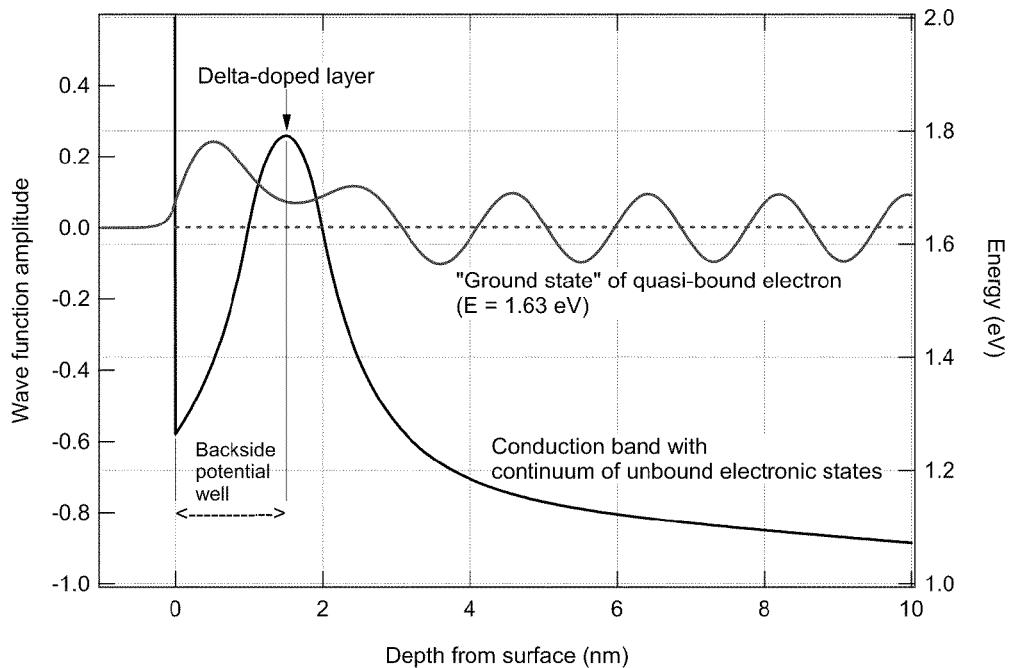
FIG. 3 is a diagram showing the calculated electronic wave functions showing one of the essential features of surface passivation by quantum exclusion. The figure shows the calculated conduction band edge and ground state wave function of electrons "trapped" between the surface and the delta-doped layer. The sharply peaked surface potential created by delta-doping reduces the backside potential well of FIG. 1 to a quantum well, nearly 1 eV in depth and <2 nm in width. Quantum confinement of electrons in this well increases the ground state energy of "trapped" electrons significantly above the conduction band edge, and the wave function extends into the bulk semiconductor where there is a high density of lower energy states. This indicates that there is no bound state for electrons at the surface, and electrons produced in the near surface region can rapidly tunnel through the delta-layer to lower energy states in the bulk silicon.
Figure 4:
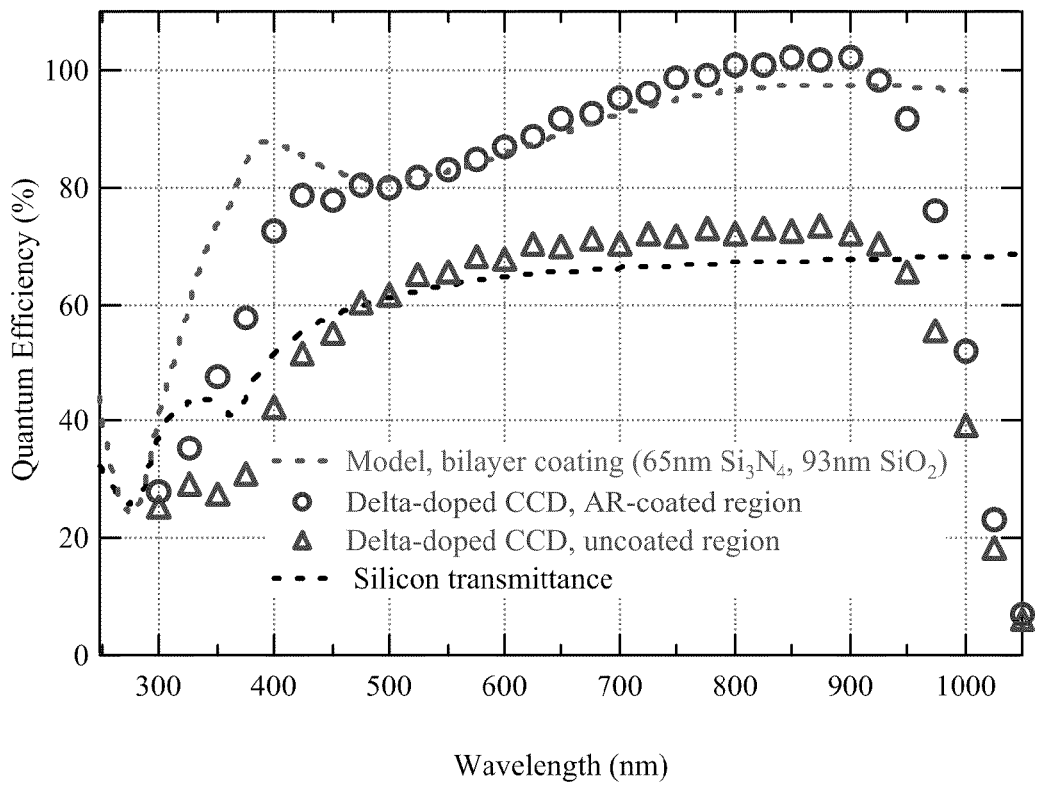
FIG. 4 is a diagram showing the quantum efficiency measurements of a delta-doped, p-channel CCD, demonstrating near reflection-limited quantum efficiency from the UV through the near infrared. Half of the CCD back surface has been coated with a bilayer antireflection coating. For comparison, the silicon transmittance is plotted in the figure for coated and uncoated regions.

Delta doping is an atomically precise epitaxial crystal growth technology. This process creates a highly doped silicon layer that is confined to several monolayers (~2 nm) at the back surface of a back-illuminated CCD. This effectively passivates the surface in such a way that it is extremely stable to environmental variation as shown in FIG. 3.

Figure 5:
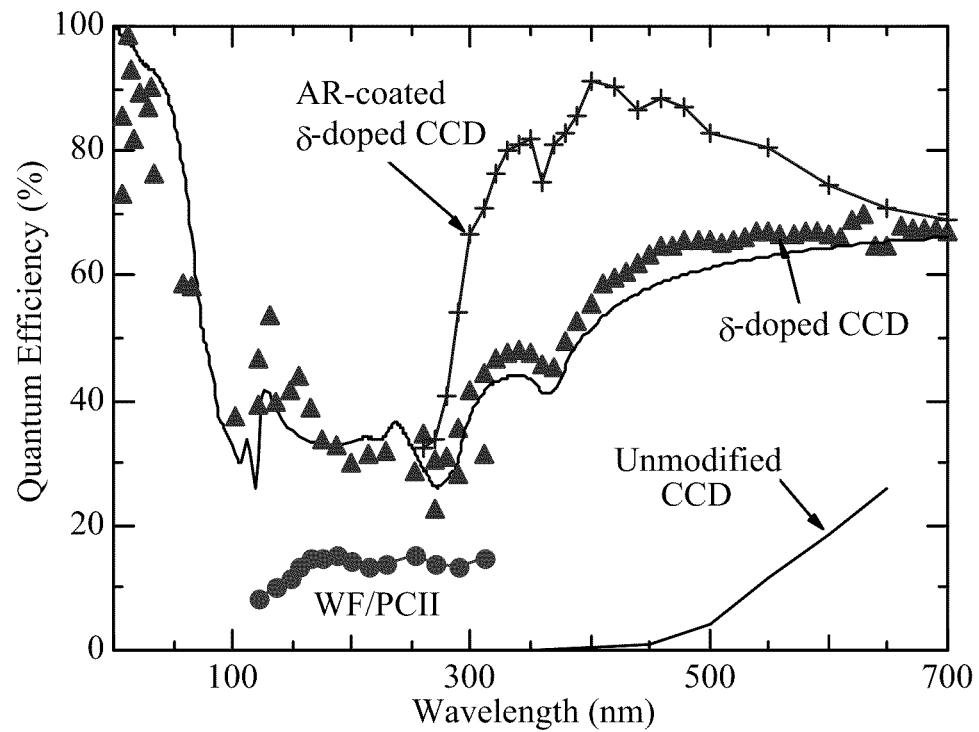
FIG. 5 is a diagram showing the quantum efficiency measurements of a delta-doped n-channel CCD, showing reflection-limited quantum efficiency from the soft x-ray through the visible regions of the spectrum. Note that the data shown in the figure have been corrected for quantum yield. For comparison, the silicon reflection limit is shown in the figure, along with quantum efficiency measurements of an antireflection-coated, delta-doped CCD.
Figure 6:
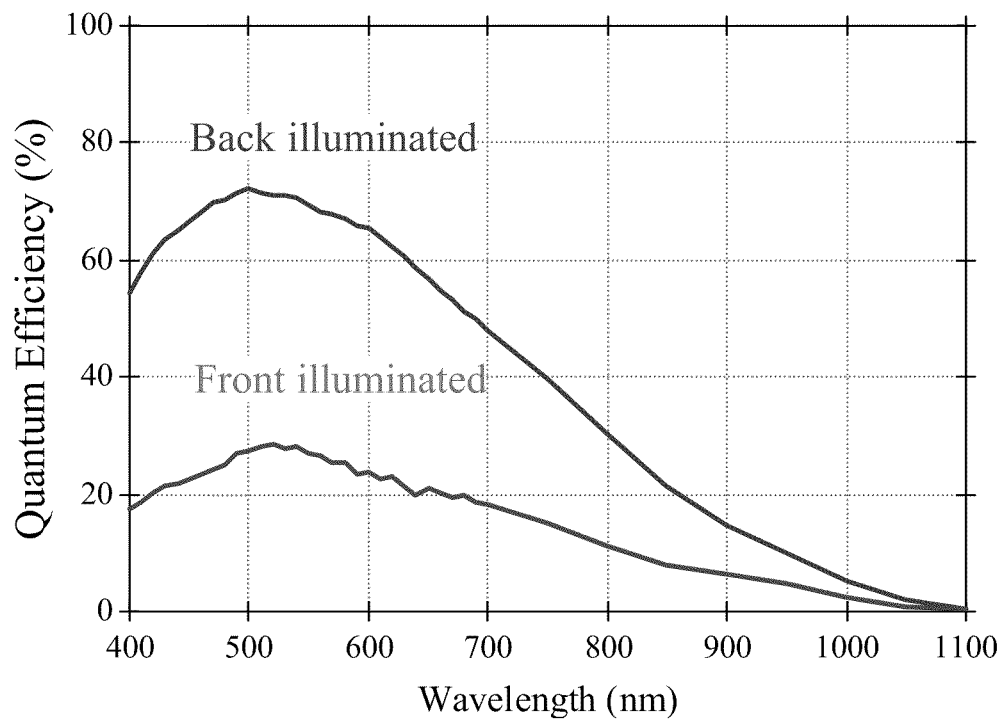
FIG. 6 is a diagram showing the quantum efficiency of a delta-doped CMOS imaging array, shown without an antireflection coating. As with delta-doped CCDs, the quantum efficiency of delta-doped CMOS arrays is limited primarily by reflection from the silicon surface. Most of the improvement in quantum efficiency achieved with back illumination results from the elimination of absorption in the front surface structures as a loss mechanism. Delta-doping passivates the silicon surface in the thinned CMOS imaging array, which is essential for the elimination of excess dark current during normal operation of the device. For comparison, both back-illuminated and front-illuminated quantum efficiencies of the delta-doped CMOS device are plotted in the figure.

Because the delta doped layer is so thin, there is essentially no optical loss in this layer, even at very short wavelengths (UV) as shown in FIG. 5.

Delta doping is compatible with a broad range of antireflection coating designs and materials. The response is easily tailored by integration of AR coatings of choices. Delta doping does not require any post process annealing and it produces very uniform flat fields.

Figure 7:
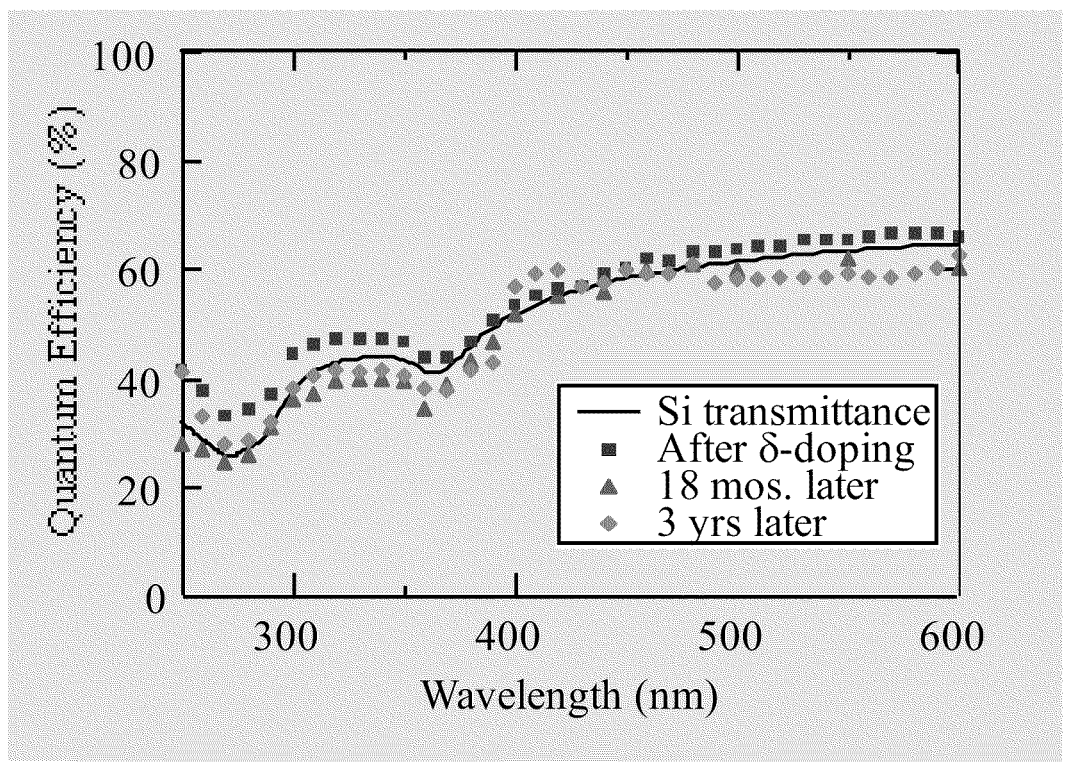
FIG. 7 is a diagram showing the quantum efficiency data from a delta-doped CCD taken over a three-year timespan, demonstrating the long-term stability of surface passivation by delta-doping.
Figure 8:
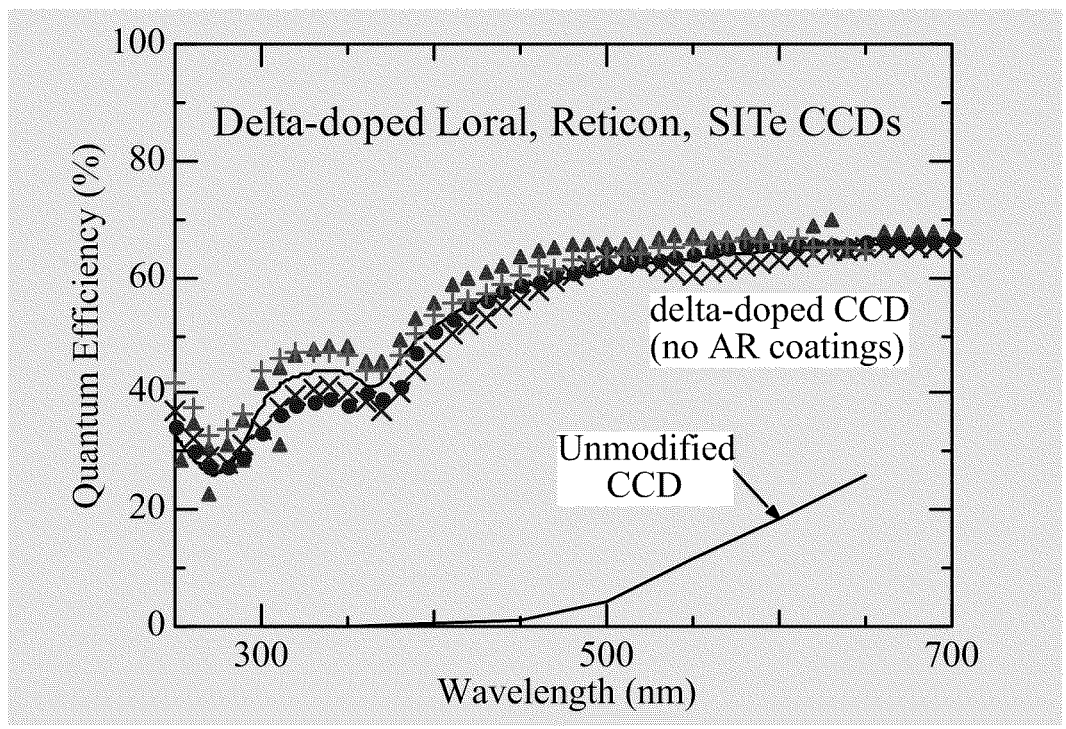
FIG. 8 is a diagram showing the quantum efficiency data comparing CCDs produced by several different device manufacturers, showing that delta-doping produces repeatable performance independent of variations in CCD design and process parameters.

One of the most important features of delta doped imaging arrays is the stability of their response as a function of time (See FIG. 7), environment, temperature, and illumination. The delta doping process is reproducible and has been demonstrated on many CCD formats manufactured by various vendors (FIG. 8).

Figure 9:
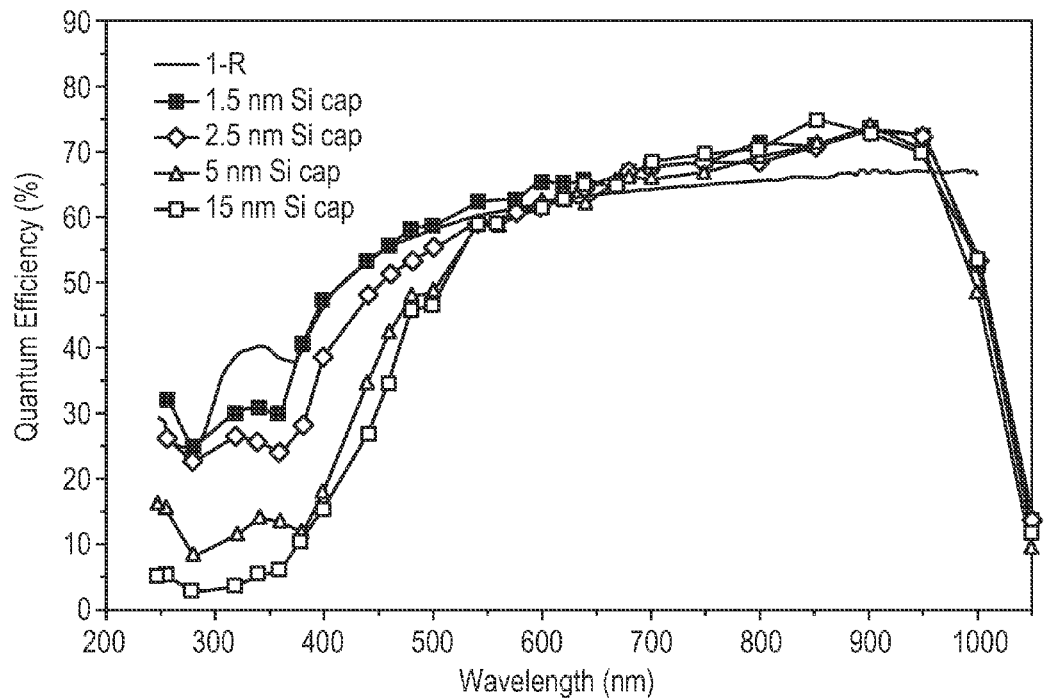
FIG. 9 is a diagram showing the quantum efficiency data from several p-channel CCDs, showing the dependence of the performance on cap layer thickness grown by molecular beam epitaxy. The highest quantum efficiency is observed for the two thinnest cap layer thicknesses. As expected from quantum mechanical calculations similar to that illustrated in FIG. 3, trapping of photogenerated charge at the surface can be prevented by placing the delta-layer within a few nm of the surface.

FIG. 9 demonstrates both the precision control afforded by MBE and the importance of having that control for back illuminated imager performance. A thin electrode is essential to QE and more importantly the stability of QE. For example, ion implanted layers are thicker than delta layers and ultimately are limited by the physics of the process. FIG. 9 shows the effect of embedding the delta layer (charge) at different depths below the back surface of the device, an exercise in atomic layer control of composition and position of the critical charge that is only possible by MBE. When the delta layer is closest to the back surface (1.5 nm cap) there is essentially no optical loss in the back surface contact over the entire range tested (250-1100 nm). The exceptional stability offered by delta doping comes from high quality epitaxial material and precise control over the dopant profile.

Bonding, Thinning and Surface Preparation Prior to MBE Growth

Fully processed wafers of CCD imagers have to be prepared for the surface passivation by suitably attaching a support wafer and then thinning the wafer to remove its low resistivity bulk silicon. Low-temperature oxide bonding is used to attach the support wafer. This bonding process can be achieved without damaging the processed circuitry as would occur under high temperature oxide bonding. The bonding process has been developed by others, is well known, and described elsewhere. Briefly, in a sequence of oxide application and flattening, the layered structure of the processed wafer is given a thick oxide coating that is smooth and flat. The wafer bond is achieved by mating the now-smooth processed wafer to an equally smooth substrate wafer. In low-temperature oxide bonding, the contact surfaces of the two wafers are meticulously cleaned of all particles. The particle cleaning process must remove all particles larger than 50 nm. The wafers are aligned and allowed to make contact. The initial point of contact draws the two surfaces tightly together and the region of bonded contact rapidly spreads over the entire surface. A suitable attachment of wafers is able to sustain its bond through the remaining processing steps. Specifically, the bond must resist shearing action in wafer grinding and Chemical Mechanical Polishing (CMP). Additionally, during MBE growth temperatures up to 450 degrees C., the oxide used in the bond must not release gasses that blister in the interface. The choice of oxide growth process and subsequent anneal steps play a large role in preventing blisters.

The backside of the CCD wafer is ground and polished with CMP down to a distance of 10 microns from its epitaxial layer. The substrate wafer protects the CCD wafer from mechanical harm. The next step is to etch to the epitaxial layer using a process that has been developed by others, is well known, and described elsewhere. Briefly, Hydrofluoric, Nitric, and Acetic acids (HNA) are mixed in a ratio of 1:3:8 and, under ultrasonic agitation, allowed to etch the bonded wafer pair. The bonded wafer is removed after the HNA has reached the CCD wafer's epitaxial layer. The 1:3:8 composed HNA automatically stops etching at the five-order-of-magnitude change in resistivity at the epitaxial layer. Additional brief etches in 1:40:15 HNA and Hydrofluoric acid with $KMnO_4$ often help to remove stains and discolorations.

Figure 10:
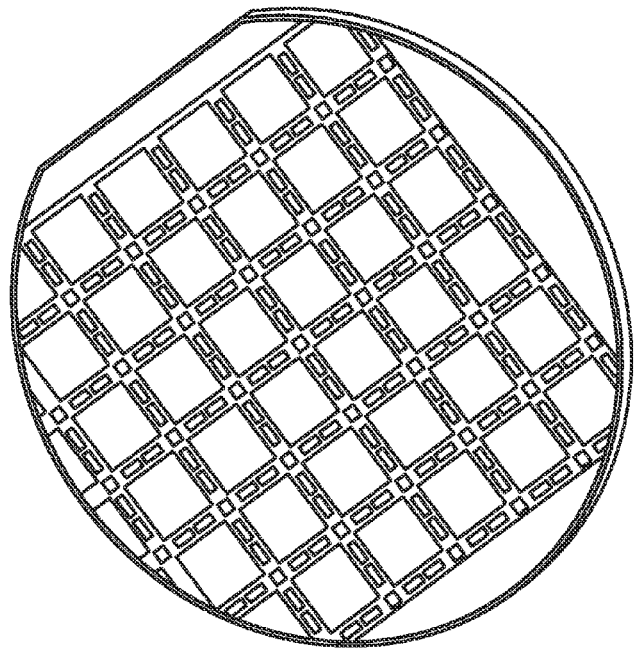
FIG. 10 is an image of a 150 mm silicon wafer with CMOS imaging that has been bonded to a support wafer and thinned to 5 microns.
Figure 11:
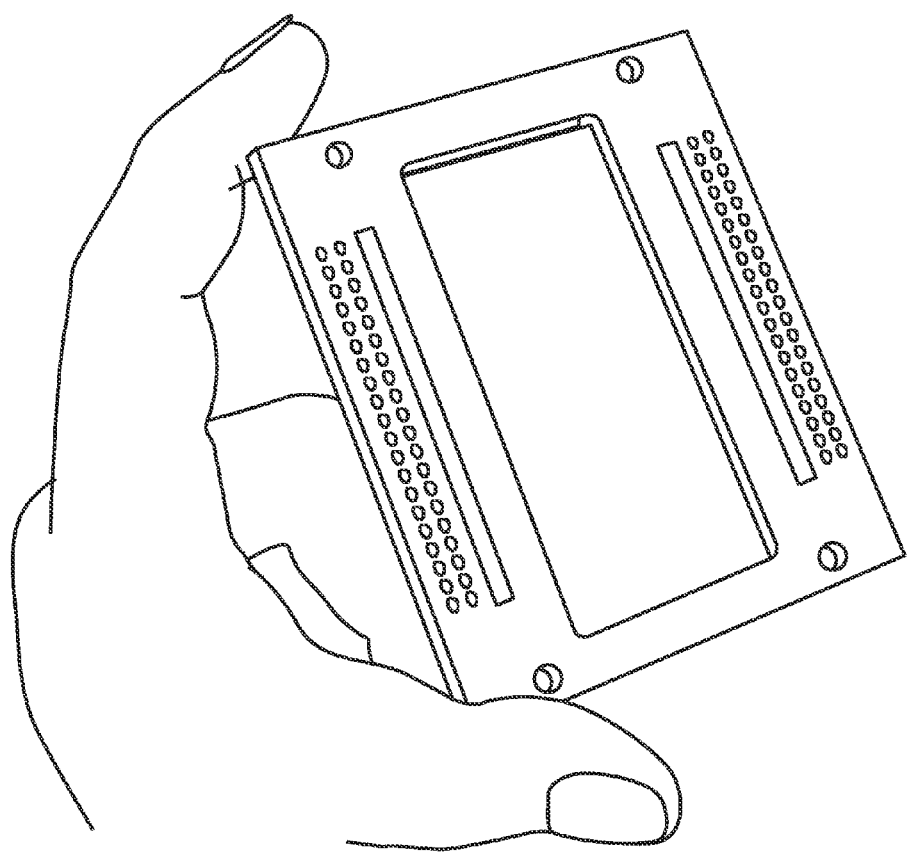
FIG. 11 is an image of a 2 k×4 k delta-doped, p-channel CCD in a prototype package.
Figure 12:
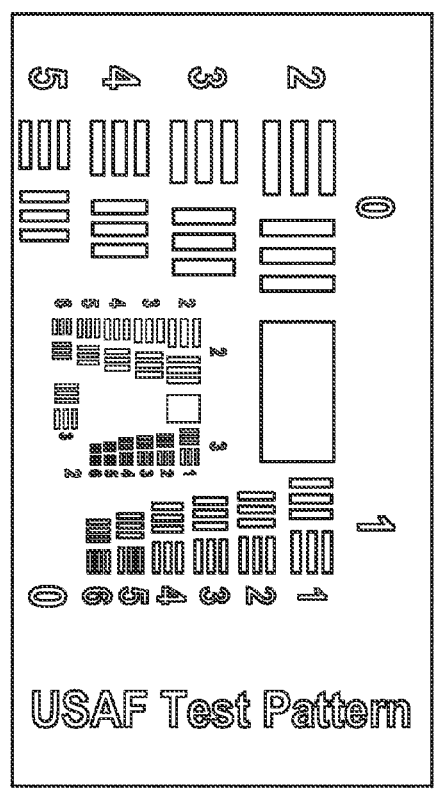
FIG. 12 is an image of a USAF test pattern taken using a 2 k×4 k delta-doped, p-channel CCD. Sharp features are indicative of full depletion of this 250 micron thick, device fabricated on an ultrahigh purity silicon substrate.
Figure 13:
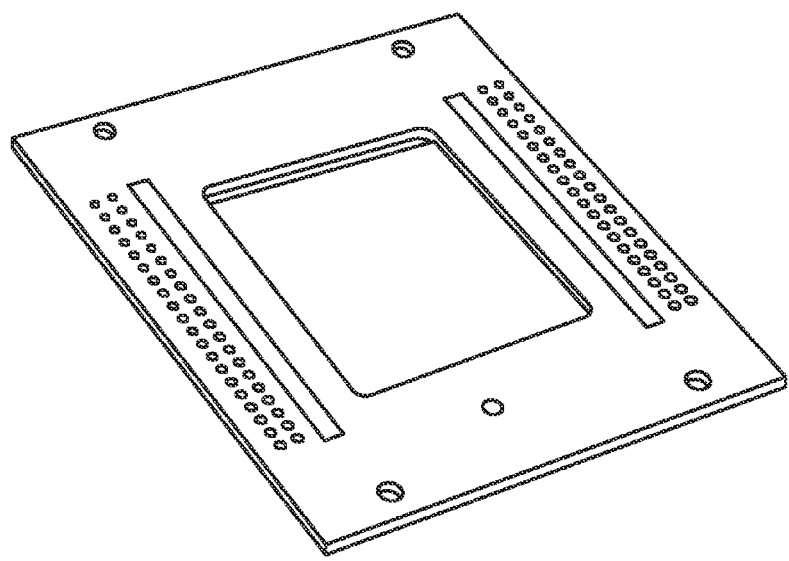
FIG. 13 is an image of a 3.5 k×3.5 k delta-doped, p-channel CCD in a prototype package.

One important feature is the dedicated chemical mechanical polishing (CMP) and chemical etching facilities and procedures. These procedures have been applied at the die or wafer level to high-speed CMOS imagers, high purity and thick LBNL CCDs with extended red response, and to hybrid silicon imaging arrays. FIG. 10 shows a 6-inch wafer thinned down to six microns while it is attached to a support substrate. Polishing is achieved with high precision using in-house CMP.

For fully depleted CCDs, the delta doped layer serves the additional important role of a uniform and stable back-surface contact for substrate biasing to achieve full depletion for excellent point spread function. An important feature of the process is that it is low temperature and can be applied to fully fabricated CCDs, complete with metallization. This enables delta doping technology to be combined with any manufacturers CCD design with minimal effort, providing a universal solution for back surface passivation and electrical contact.

High Throughput Processes and Manufacturability

An important element of a high yield high throughput process is to increase the capacity and yield of delta doping processes so that complete wafers containing fully fabricated devices can be delta doped. An 8-inch MBE with multiple wafer capacity is use. Multiple wafers can be prepared and loaded into the machine and delta doping a lot run can be accomplished in a matter of days.

Figure 14:
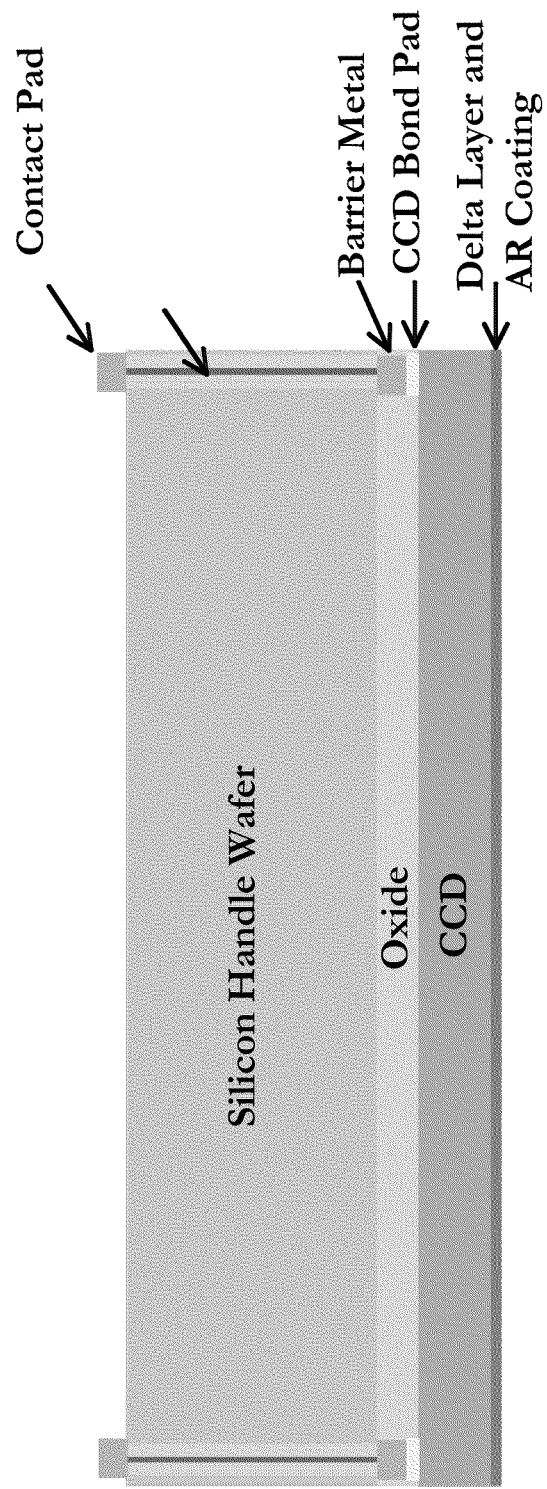
FIG. 14 is a diagram that shows a schematic cross section of an AR-coated, delta-doped CCD that was bonded to a silicon handle wafer prior to thinning and delta-doping. In this figure, through-hole vias have been patterned on the handle wafer and filled with metal in order to contact the buried CCD bond pads. This bonding process provides mechanical support for the thinned device, which is a key step in wafer-scale MBE processing.

FIG. 14 is a diagram in schematic form that shows a back illuminated CCD having a flat, 100-micron thick CCD with high and stable QE over the 400-1000 nm wavelength range. A handle wafer is used as a fanout to mirror the bond pads of the CCD at their exact locations. The handle wafer is prepared by producing metal-filled via holes in thick silicon wafers. Oxide is deposited on the wafer for direct low temperature wafer-wafer bonding. In parallel, the CCD wafer is also prepared by deposition and planarization of oxide on the circuitry frontside surface. After low temperature direct bonding, the device is robust and can be thinned down to 100-micron. Devices are then delta doped, AR coated, and individually packaged, screened and fully tested.

Device Fabrication

We now describe several procedures for fabricating back illuminated devices having delta doped regions.

Figure 15:
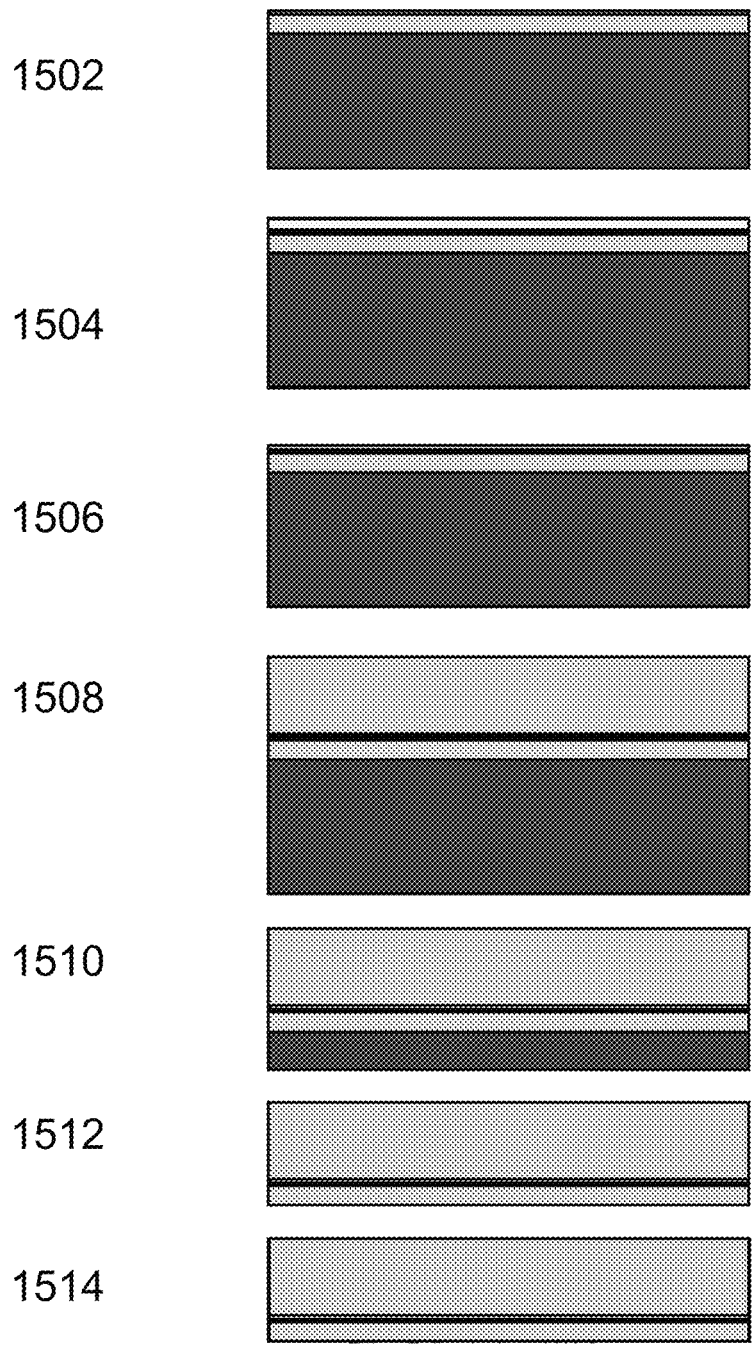
FIG. 15 is a diagram illustrating in cross sectional view the process flow showing device structure at various stages of the processing, including bonding, thinning, surface preparation, MBE growth, post-growth surface passivation (optional), and AR coating (optional).

FIG. 15 is a flow diagram that illustrates steps in the fabrication of devices using a technique involving full wafer support. At step 1502, there is provided a front surface CMOS structure defined in 10 μm epi on a 8" substrate, which is ~800 μm thick. Step 1502 shows a starting device. The substrate is shown as dark gray, silicon epilayer comprising the device is shown as light gray, and the thin dark layer at top comprises the electronic structures patterned on the silicon epilayer that perform essential device functions. At step 1504, a thick oxide is deposited on the front surface of the wafer. Step 1504 show the deposition of a thick dielectric layer as preparation for bonding. At step 1506, the oxide is planarized. Step 1506 shows the planarization of the surface as preparation for bonding. At step 1508, the wafer is bonded to a silicon support wafer. At step 1510, the device layer is CMP to approximately 50 μm thickness. Step 1510 shows coarse thinning (e.g., grinding, polishing) to reduce the thickness of the device substrate. Step 1512 shows ex vacuo surface preparation steps, including final chemical thinning and surface preparation prior to entry into the vacuum system. At step 1512, an etch in HNA chemical etch is used to expose the epi back surface. In some cases, HNA mixtures can produce Si etch rates well over 100 μm/min, such as Spinetch products from General Chemical, 90 East Halsey Road, Parsippany, N.J. 07054. At step 1514, the wafer is chemically cleaned to prepare for MBE growth. Step 1514 shows in vacuo surface preparation and MBE growth as described in this application.

MBE growth adds very little material to the wafer. A diagram that might be provided would show little physical change, because the thicknesses involved are so small. The MBE growth procedure includes the steps of back surface preparation in a glove box having a nitrogen atmosphere, including a UV ozone and HF spin cleaning, and loading devices into a multiwafer platten on an 8" MBE machine; performing the MBE growth of the delta-doped layer, approximately 3 nm thick; growing an oxide layer, for example by steam oxidation, such as could be done in a glove box just by letting wafers sit in high humidity for 30 minutes; and applying an AR coating. From this point on, the back surface must not be exposed to chemicals or contaminants that could affect either the AR coating or delta-doped layer. The delta-doped layer is extremely robust, but it is very thin, and the AR-coating must be kept free of contaminants that might absorb UV light.

Figure 16:
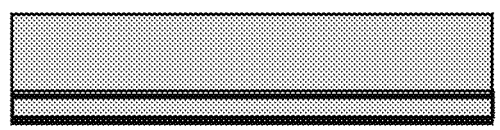
FIG. 16 is a diagram illustrating in cross sectional view the process flow showing final steps, including AR-coating, patterning, etching, and packaging.
Figure 16:
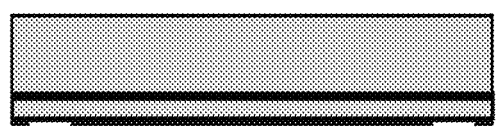
Figure 16:
Figure 16:
Figure 16:
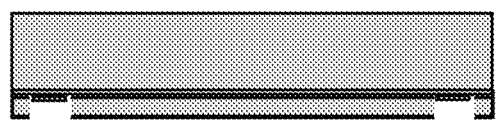
Figure 16:
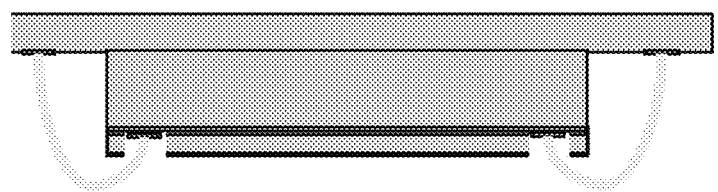
Figure 17:
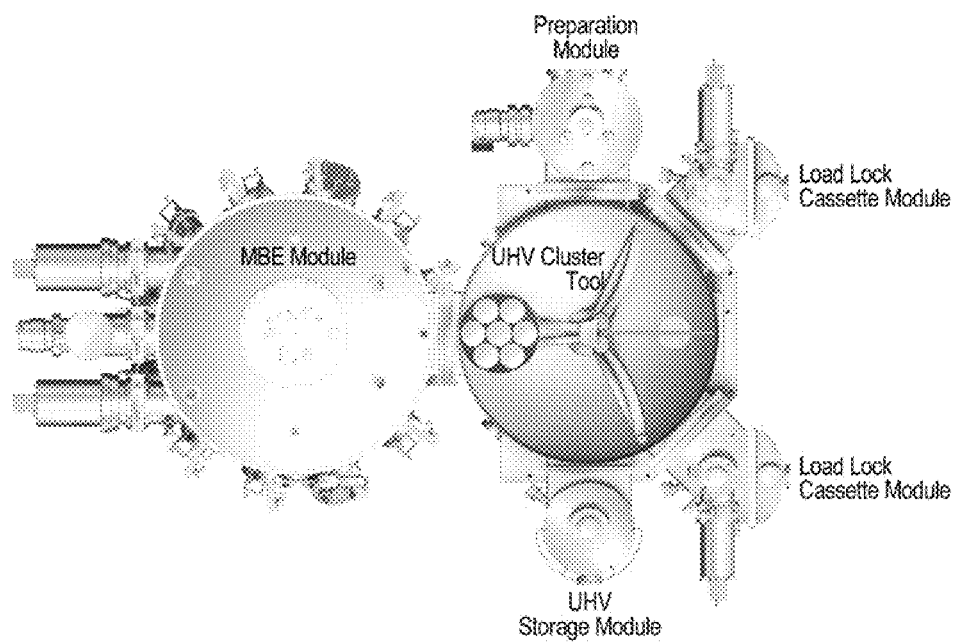
FIG. 17 is an image of a Veeco Gen200 MBE system showing cluster tool and various modules for automated wafer transfer, storage, and processing.
Figure 18:
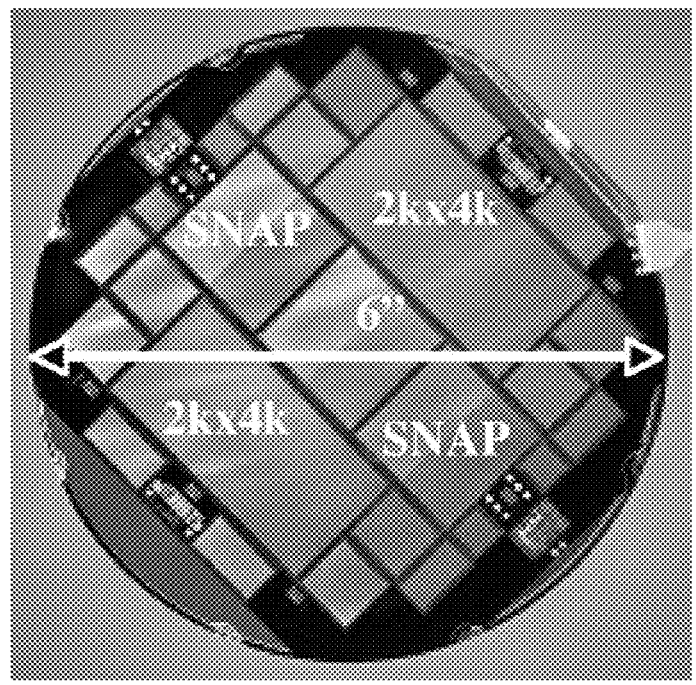
FIG. 18 is an image of 150 mm wafer that has been patterned processed to form multiple imaging devices and test structures.
Figure 19:
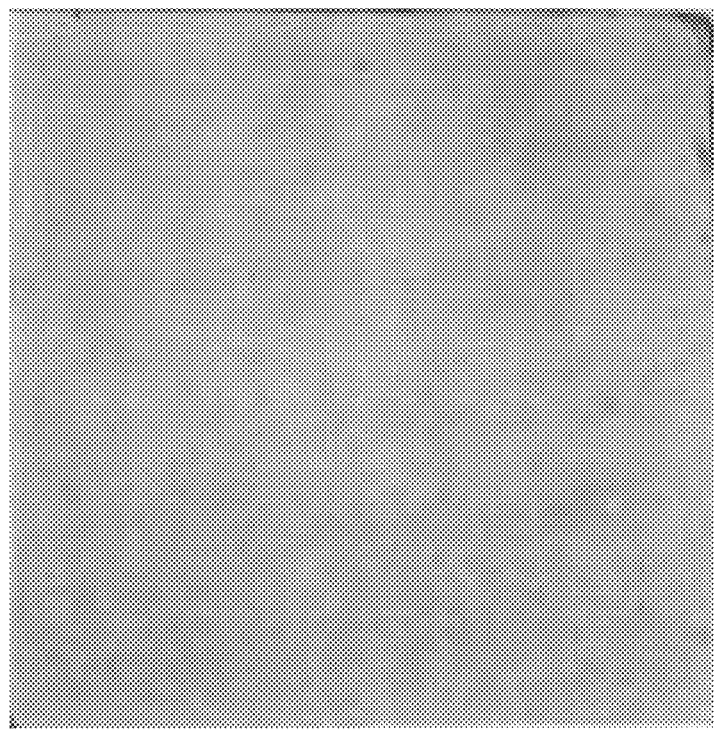
FIG. 19 is a flat-field ultraviolet image taken with delta-doped CCD, showing excellent uniformity.

FIG. 16 is a flow diagram that illustrates packaging steps in the fabrication of devices according to another embodiment. At step 1602, thick photoresist is deposited, in quantity sufficient to withstand reactive ion etching (RIE). Step 1602 shows the deposition of mask material (e.g., photoresist) on the back surface of the device structure from Step 1514. At step 1604, the photoresist is patterned, with a pattern determined by the size and position of bond pads. It is preferable to have large bond pads, to expose a larger area for wire bonding. Step 1604 shows the patterning of mask material to expose the back surface over the bond pads. At step 1606, the RIE is performed to expose the bond pads from underneath the wafer. Approximately 10 µm of silicon is removed to expose the pads. Step 1606 shows etching through the silicon epilayer to expose device bond pads from the back. At step 1608, metal is deposited to form a contact layer. Possible methods for the deposition include the use of shadow masks, ALD, or electrodeposition. Step 1608 shows deposition of contact layer (which is optional). At step 1610, the photoresist is stripped and the devices are cleaned. Step 1610 shows the stripping of mask material and cleaning the devices. At step 1612, a package substrate is applied and the devices are wire bonded to contact pads. Step 1612 shows dicing the wafer and package individual devices.

Vacuum Integrated Selective Chemical Removal of Native Oxide Prior to MBE Growth Molecular Beam Epitaxy (MBE) is a technique used for the growth of crystalline materials on a chosen substrate. In conventional practice, to attain the required material properties in the MBE-grown film, the substrate surface is carefully prepared prior to MBE using a combination of UV-ozone exposures, and aqueous HF spin cleans to selectively remove the native oxides and surface contamination known to form on silicon substrates after air exposure. However, this process is labor intensive, is known to leave residue, and is not readily scalable to processing of large substrates (6" diameter and greater).

Processes that utilize gaseous or vapor phase compounds are readily scalable to large substrate areas. Recent work published in the open literature and US patents show that surface pretreatments combining gas-phase mixtures of $NH_3$, $NF_3$, and HF have successfully removed the native oxide from silicon. As these processes have shown to be selective, they have typically been employed to clean oxide from silicon transistors prior to forming contacts.

As these reactions occur at relatively low substrate temperatures (100 C and below), these same process conditions are directly ammenable to use as a surface pretreatment prior to low temperature (<500° C.) MBE-growth. However, to achieve the same surface quality on UV-Vis detectors using a "dry" process, it is necessary to replicate the functionality of the two discrete steps (UV-ozone and HF spin clean) of the JPL baseline process. As described herein, these two steps are integrated into one preparation chamber vacuum integrated on a cluster tool with an MBE-growth chamber. It is also feasible to have two separate vacuum integrated preparation chambers that separate these two surface preparation steps.

Turning to the single preparation chamber embodiment, a plasma source is used to create reactive ionic and/or atomic species (hydrogen, oxygen, argon) and/or ozone to clean carbonaceous residue from the substrate surface. It is recognized that the same reactive clean could also be completed in a vacuum integrated chamber using any one of several different methods and equipment that generate reactive ionic and/or atomic species (hydrogen, oxygen, argon) and/or ozone. These might include, but are not limited to: a remote plasma source, a UV lamp, a direct ICP, ECR, RIE, or other plasma source, or a thermal anneal chamber for introduction of reducing, oxidizing, and/or inert gases.

The step to remove carbonaceous residue is subsequently followed by a step to remove the silicon oxide from the surface of the silicon. There are many possible embodiments of this oxide removal process. A preferred method utilizes an exposure to $NH_3$ and/or fluorine containing gases. The fluorine containing gases include $NF_3$, $F_2$ and HF. These gases can be introduced concurrently or sequentially. The gases may also be broken down utilizing a remote or direct plasma source to generate more ionic and/or atomic reactive species. These gases react with the oxide on the silicon substrate to form a volatile product that is pumped away. The result is a hydrogen terminated silicon surface, ready for MBE-growth.

A preferred application of this method is to concurrently add $NH_3$ and $NF_3$ in a ratio of greater than 2:1 through a remote plasma source. The silicon substrate is kept at a temperature below 100° C. during this exposure. The reactive species generated by the plasma source react with the silicon oxide to form an ammonium hexafluorosilicate layer. When the $NH_3$ and $NF_3$ are combined in the right ratio, the reaction is extremely selective to silicon dioxide and does not etch the underlying silicon. Once the reaction is complete, the plasma source is shut off and temperature of the silicon substrate is raised above 100° C. At the higher temperatures the ammonium hexafluorosilicate layer becomes volatile and it evaporates or sublimes from the silicon surface. As stated earlier, the result is a hydrogen terminated silicon surface, free of impurities and ready for MBE-growth.

While the above is a preferred embodiment of the dry process for oxide removal, it is expected that the $NH_3$ and $NF_3$ reagents could be replaced by a suitable combination of other nitrogen, hydrogen, and fluorine containing gaseous or vapor species, such as hydrogen, nitrogen, hydrazine, HF vapor, and $F_2$ gas.

These two steps, oxidation to remove carbonaceous residue and oxide removal, can be repeated multiple times, if desired, to improve the cleanliness of the silicon surface. The oxidation step will grow a new silicon oxide layer on the hydrogen terminated silicon surface, which can then be etched away by the $NH_3$ and $NF_3$ oxide removal step. Because of the differences in free energy of different crystallographic surfaces or planes in a crystal, repeated oxidation and oxide removal may also provide a more uniform surface, for example by removing small asperities of dimensions of one or more atoms.

An important improvement in cleaning the wafers prior to MBE growth has been developed. This process for chemical removal of native oxide prior to the MBE growth can be practiced within the MBE apparatus. Such a process is expected to provide better cleanliness, less difficulty in wafer handling, and improved throughput and yield.

Figure 20:
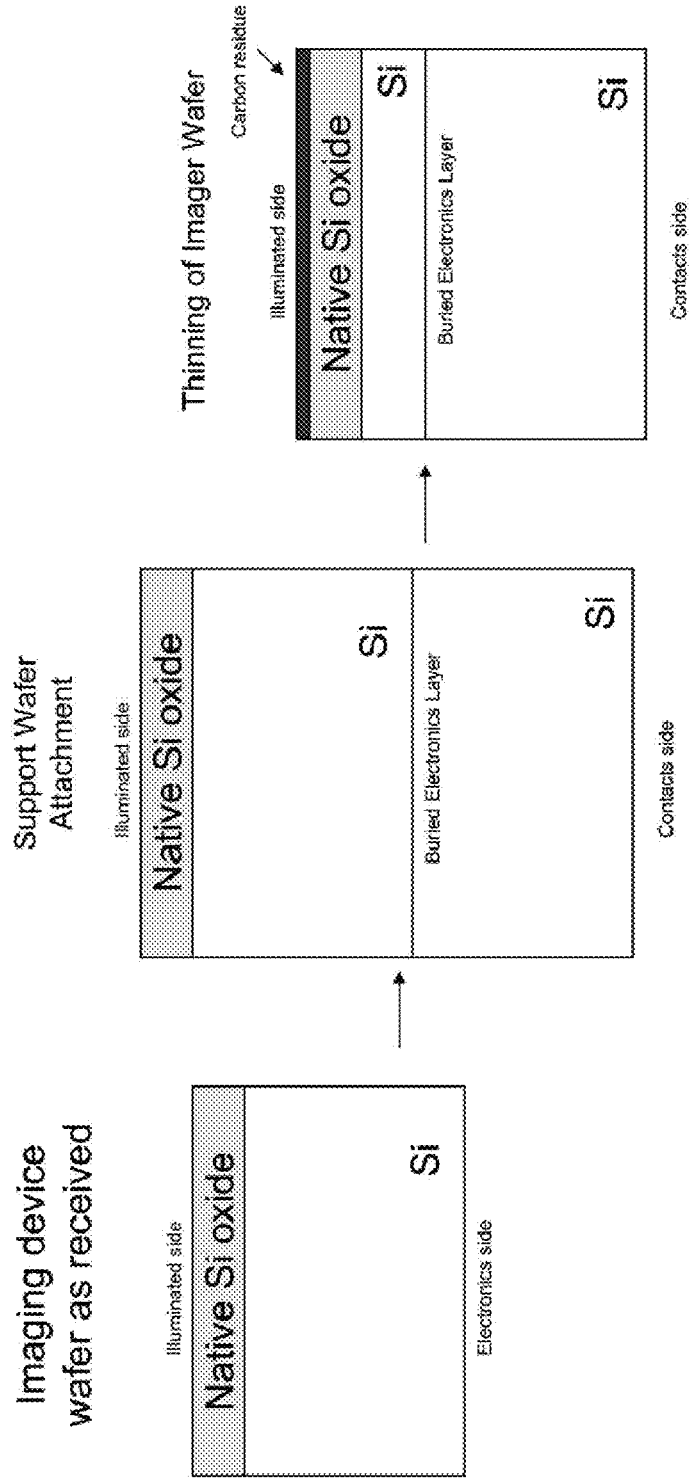
FIG. 20 is a diagram showing a schematic representation of bonding and thinning process.

FIG. 20 is a diagram that illustrates some preprocessing steps prior to native oxide removal, in which an imaging device is attached to a support wafer, and the imaging device is then thinned, leaving a native silicon oxide layer that is contaminated with carbon residue.

Figure 21:
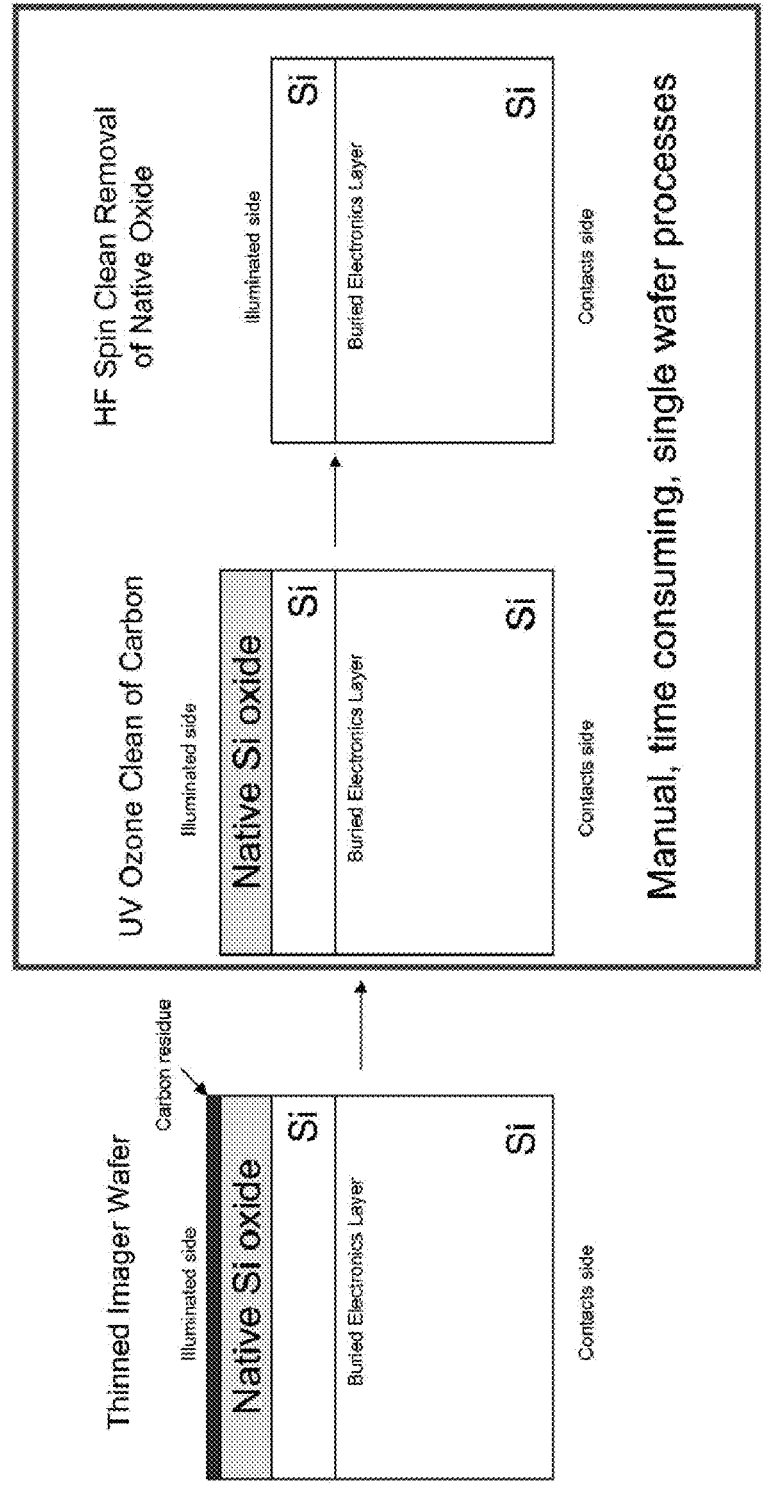
FIG. 21 is a diagram showing the steps in cleaning a wafer surface using conventional processing.

FIG. 21 is a diagram that illustrates cleaning technology using conventional processing techniques. Carbon is cleaned using a UV Ozone process, and HF Spin Clean is used for final surface preparation steps to remove the native oxide. Until now, these processes have been performed in dedicated systems that cannot be easily integrated with Si MBE technology.

Figure 22:
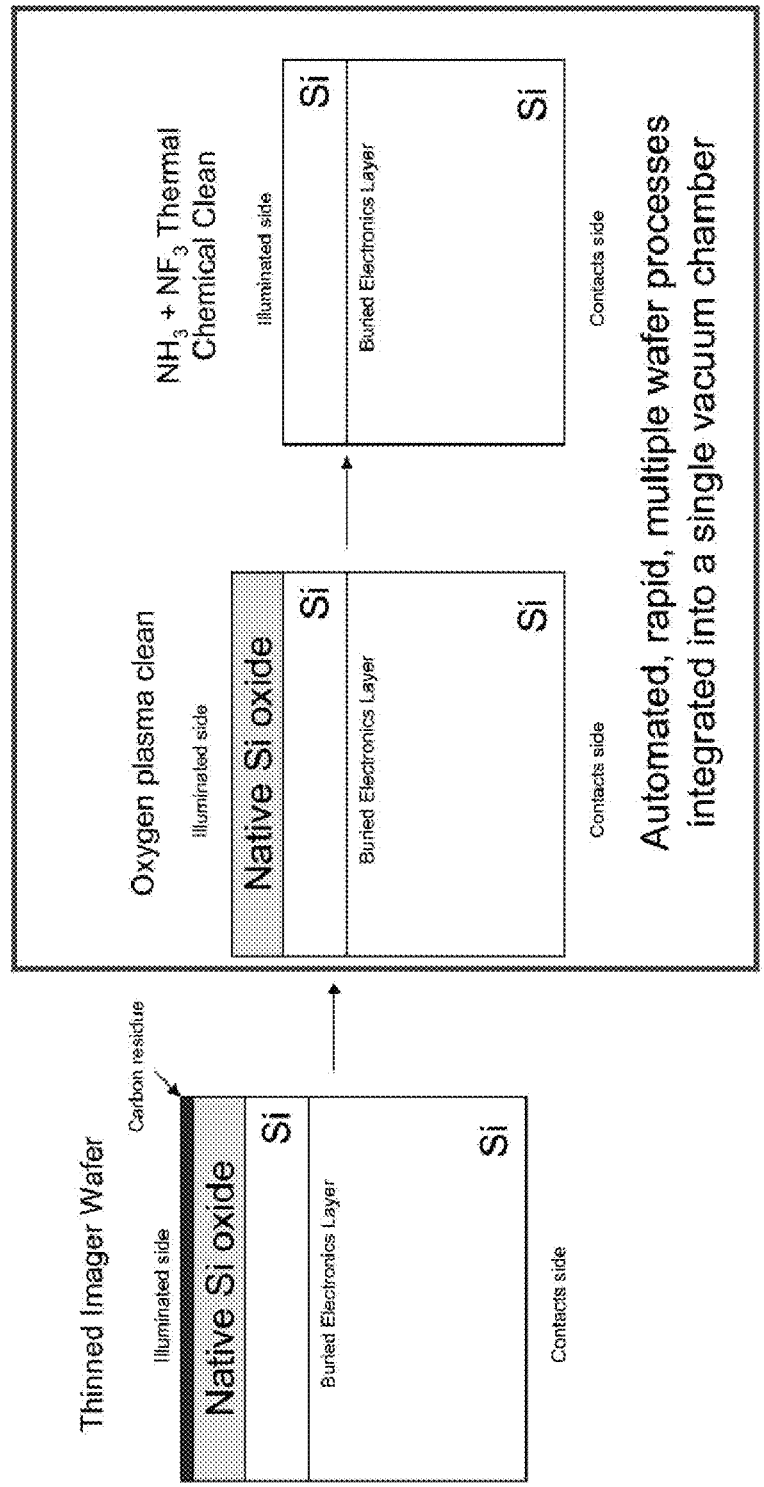
FIG. 22 is a diagram showing a schematic representation of in vacuo wafer-level surface preparation processes.

FIG. 22 is a diagram that shows the process flow in a new wafer cleaning technology that is compatible with Si MBE processing, and can be implemented in an MBE system. The process is a dry process performed in a vacuum chamber. The carbon residue is removed with an oxygen plasma clean. The native oxide is then removed using a $NH_3+NF_3$ gaseous chemical cleaning process. In the new process, the apparatus needed for plasma and thermal cleans is mounted to a cluster tool, enabling fully integrated, fully automated processing with the subsequent Si MBE. As stated earlier, these dry process cleaning steps can be separated into dedicated chambers (one each for carbon removal and oxide removal) if desired. The reactive species for dry cleaning of these silicon substrates may also be generated by UV or other alternative methods that do not involve a plasma. It is expected that a plasma of other chemical species than oxygen can also be used to remove carbon from the surface of the wafer.

Figure 23:
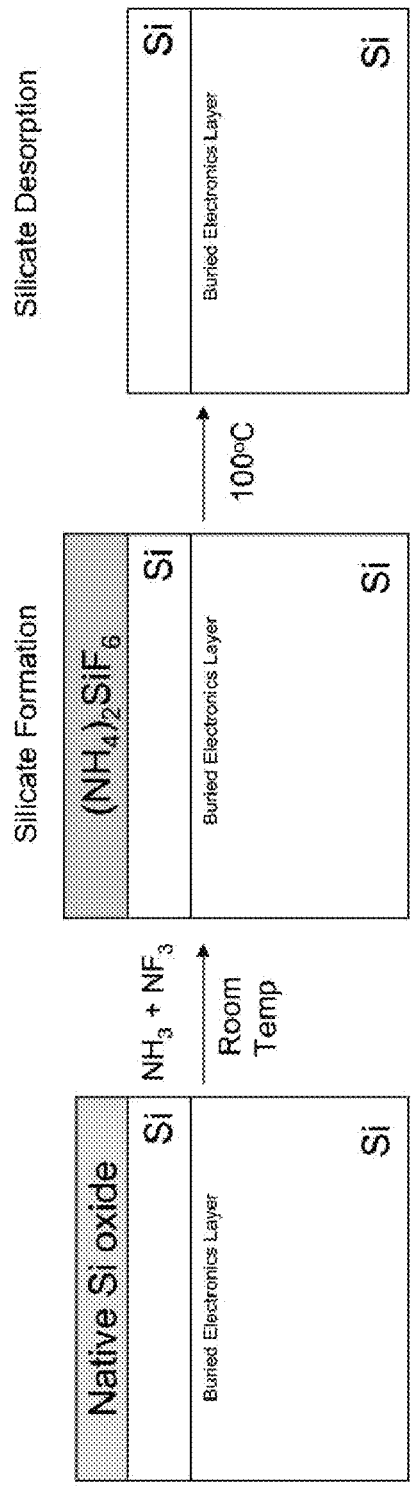
FIG. 23 is a diagram showing a schematic representation of an in vacuo native oxide removal process, producing a clean, hydrogen-terminated surface that is ready for MBE growth.

FIG. 23 is a diagram that illustrates the chemistry that occurs in the $NH_3+NF_3$ plasma cleaning process. A reaction is performed at room temperature whereby Si oxide reacts with $NH_3$ and $NF_3$ introduced as gases through a remote plasma source to form an ammonium fluorosilicate, $(NH_4)_2SiF_6$. The ammonium fluorosilicate can be thermally desorbed from the silicon wafer by heating, leaving a hydrogen-bonded silicon surface. If necessary, the oxygen plasma clean and the $NH_3+NF_3$ plasma clean process can be repeated to assure that the Si wafer is clean.

Figure 24:
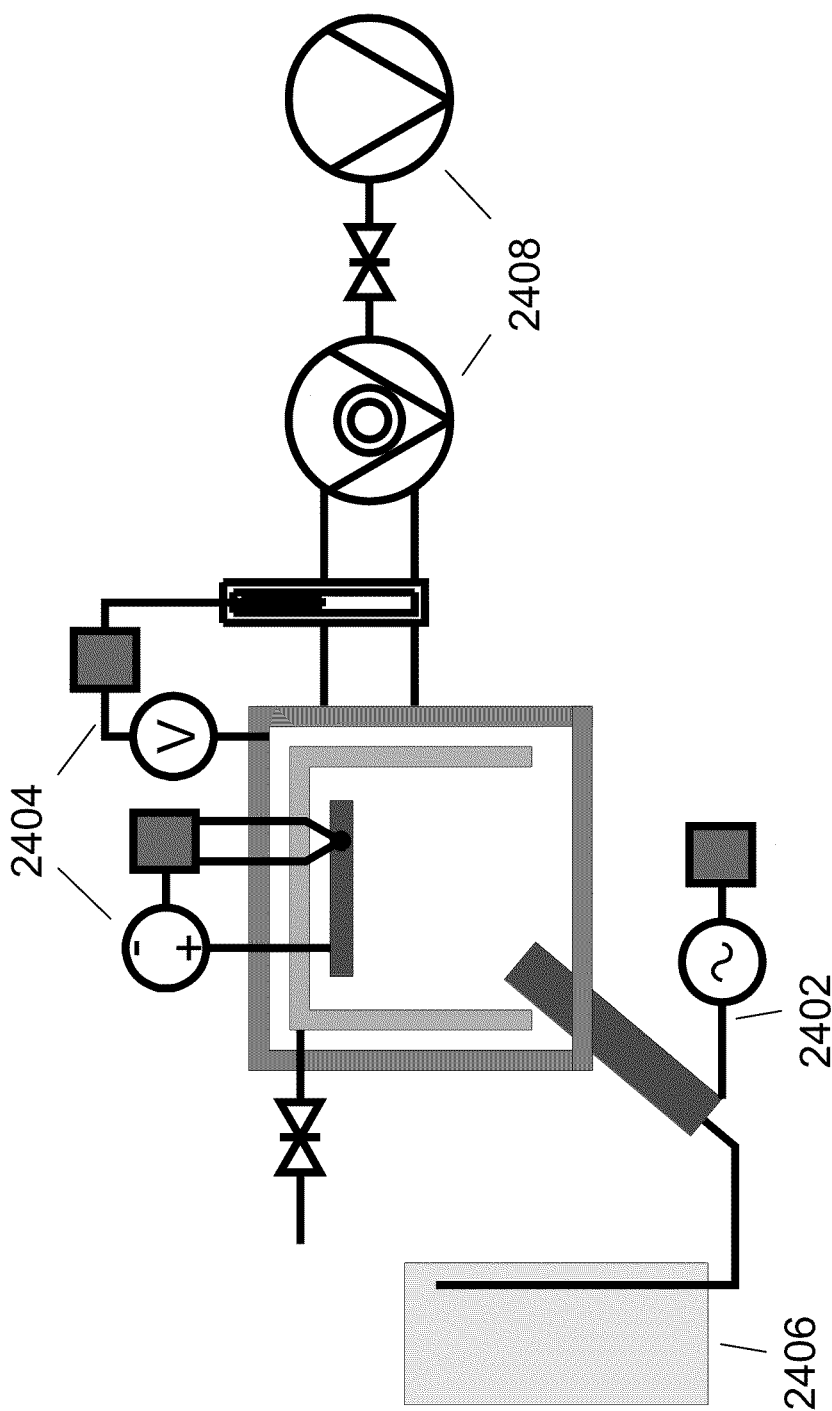
FIG. 24 is a schematic diagram showing an in vacuo surface preparation chamber in the JPL MBE system.

To implement this procedure, as illustrated in FIG. 24, an integrated vacuum surface preparation chamber is outfitted with a plasma source 2402, a throttle valve and controller 2404, and a reactive gas supply 2406. Pumping equipment 2408 including a MagLev Turbo pump backed by dry mechanical pump is provided. This integrated vacuum surface preparation system is integrated in a cluster tool arrangement to enable selective chemical removal of organics and native oxides prior to MBE growth, and transfer of a cleaned device to the MBE growth chamber without air exposure, for example by way of a valved mutual communication port. This arrangement enables a high quality hydrogen terminated surface to be available for silicon epitaxy. $NH_3/NF_3$ dry cleaning processes have not been applied to surface cleaning and preparation prior to the surface passivation step in the fabrication of scientific grade UV-Optical imagers.

Figure 25:
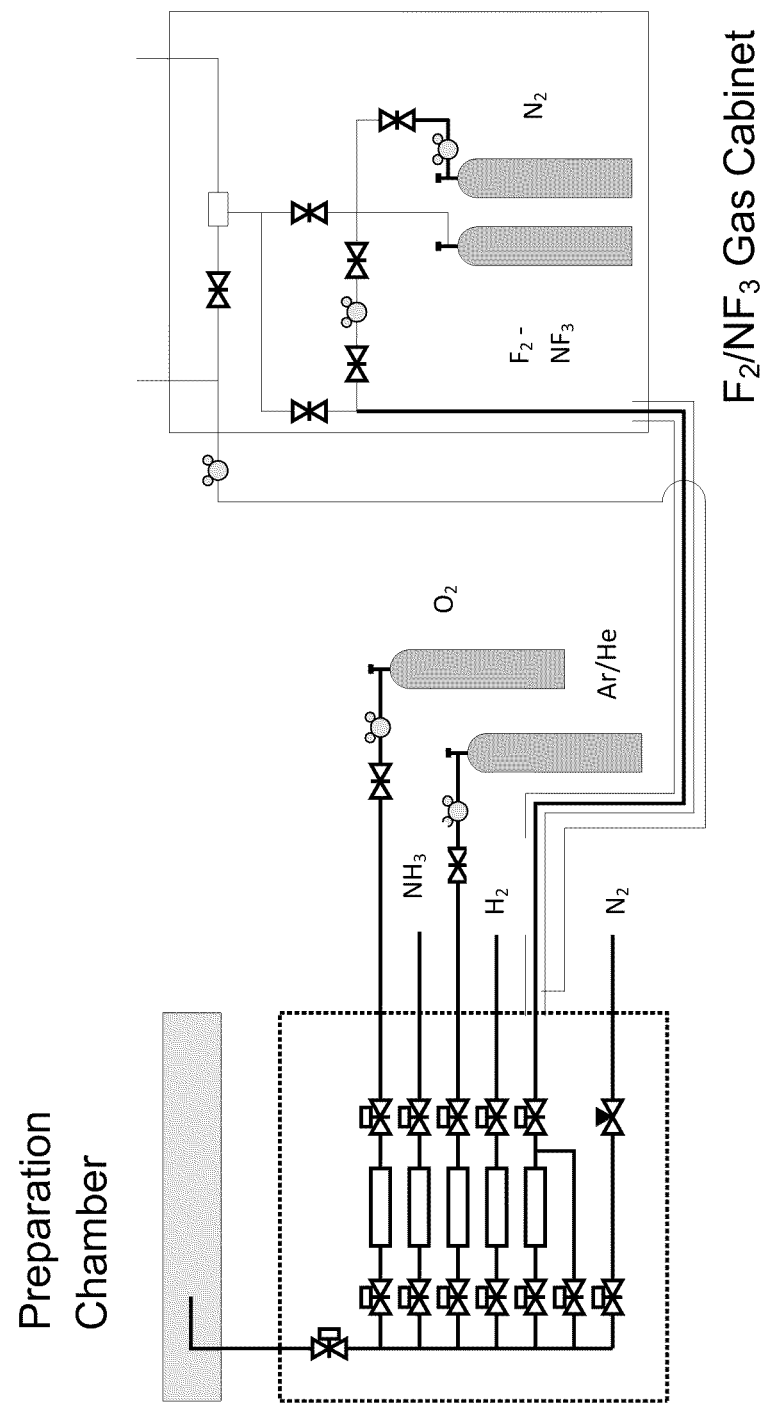
FIG. 25 is a schematic diagram of gas manifold providing process gases to the in vacuo surface preparation chamber in the JPL MBE system.

FIG. 25 is a schematic diagram illustrating the provision of reagent gases ($O_2$, $NH_3$, $F_2/NF_3$, and $H_2$) and carrier gases ($N_2$, Ar, He) to the preparation chamber of the MBE system.

The method described provides a significant process throughput and cost advantage over the wet chemical methods currently employed. This method is expected to improve the performance of other back surface passivation techniques such as in situ doped polysilicon.

Figure 26:
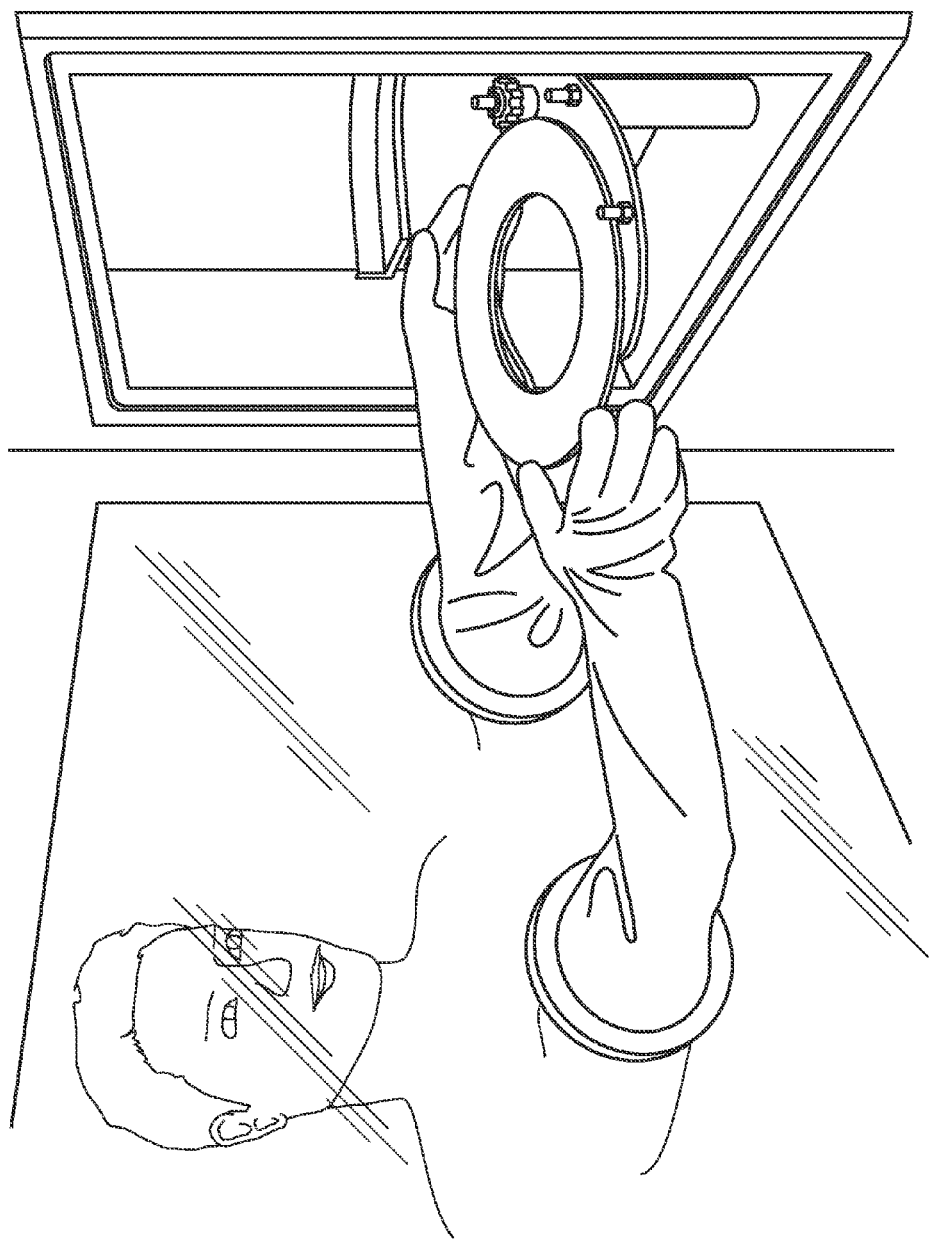
FIG. 26 is an image showing in the foreground an 8 inch silicon wafer on a platen being transferred between a glove box and a load lock, with components of the Veeco GEN200 Silicon MBE apparatus to which the glove box and load lock are connected visible in the background.

State-of-the-art CCD fabrication facilities currently use six inch wafers, and state-of-the-art CMOS imager foundries use eight inch wafers. In order to enable full wafer scale production of delta-doped CCDs and CMOS detectors, JPL has recently acquired a production grade Veeco GEN200 Silicon MBE. FIG. 26 is a diagram showing in schematic form the components of the Veeco GEN200 Silicon MBE apparatus. The new MBE is equipped with a cluster tool with an automated sample transfer system that can move wafer cassettes between chambers under computer control. Attached to the cluster tool are a load-lock chamber and a UHV storage module with motorized elevators, enabling the loading and storage of up to eight wafer cassettes at a time. Each wafer cassette holds a 10" platen, which can be configured for single wafers up to 8" in diameter or for multiple smaller wafers. The preparation chamber is separately pumped, and equipped with a sample heater, gas inlet ports, and an rf source configured for implementing in vacuo surface preparation processes. The preparation chamber was custom made according to JPL requirements. The growth chamber has 12 effusion cell ports to accommodate multiple dopant materials, and dual e-beam sources enabling codeposition of silicon and up to four additional source materials. The entire system is under computer control, enabling the development of automated multi-wafer processes for high-throughput delta-doping of CMOS and CCD wafers. It is recognized that silicon processing technologies have tended to migrate towards larger substrates over time. This methodology of vacuum integrated MBE processing of silicon substrates is readily scalable as the size of these substrates increases.

In addition to the in-vacuo surface preparation apparatus, the system has also been integrated with an ex-vacuo surface preparation hardware and process flow. The ex-vacuo system includes a UV-ozone processing chamber capable of holding device wafers up to 8 inches in diameter matching the capability of the 8-inch MBE system to which it is attached.

A sample is first processed in the UV-ozone processing chamber. Following UV-ozone surface treatment the sample is transferred into a dual glove box system having a transport chamber where humidity and oxygen levels are continuously monitored and controlled to maintain near-zero conditions. The system maintains lower than 2 ppm oxygen and humidity to ensure that no further surface reactions occur on the prepared samples. The glove box system is sized to accommodate full cassettes of 8-inch device wafers ensuring that the glove box environment remains sealed against the atmosphere. This increases growth throughput by allowing processing, storage and transfer of large quantities of wafers all under the highly controlled glove box environment. Cassette operation in the loading and unloading of the glove box ensures that the atmospheric exposure of the glove box load lock chamber is limited to a single opening and closing per batch reducing the overall contamination risk.

The first of the two glove boxes contains an HF spin cleaner for surface deoxidation and cleaning. This HF spin cleaner is capable of holding 8-inch wafers in order to match the capability of the 8-inch MBE system. The HF spin cleaner is fully computerized allowing total automation of the spin and dispensing operations. Full computer control of the spin and dispense operations ensures high repeatability from wafer to wafer and batch to batch. Transfer into and out of the spin cleaner is a manual operation but this minimally impacts the high throughput operations as the spin process is more time consuming than the transfer itself. The repeatability of the operation also outweighs any loss of time for single manual transfers through the spin cleaner. Additionally, the controlled environment of the glove box significantly minimizes the problems with surface degradation after processing such that a full cassette of wafers can be spin processed completely prior to transferring to the loading stage.

The second of the two glove boxes contains the work area for loading and unloading platens for use in the 8-inch MBE as well as the physical interface from the glove box to the MBE. Once again this is a fully controlled environment ensuring that the freshly prepared surfaces are not damaged or contaminated. In this second glove box the cassettes of device wafers can be loaded into the platens that are then transferred to the load lock chamber on the MBE. With the load lock chamber opening only into the glove box, the environment of the load lock can also be maintained in an inert state. This inert state accomplishes not only the task of maintaining a clean environment to prevent contamination of the device wafers but also improving pump down speed of the load lock. The faster pump down speed allows the device wafers to enter the MBE process stream more quickly than conventional atmospheric load lock access. Time savings between the glove box load lock and a conventional atmospheric load lock can exceed 50%.

The final stage is a load lock that is capable of holding up to eight system platens with the number of wafers per platen dependent on the wafer size. For the maximum 8-inch device wafer, each platen can hold one wafer. A storage module integrated with the load lock can hold an additional eight platens allowing the system to be loaded with up to sixteen platens for processing. The fully automated MBE can now transfer samples through the MBE process stream at which point finished samples can be unloaded from the load lock while others await processing in the storage module. This permits overlapping load and unload cycles that provide one of the largest throughput gains of the entire system. Unloading into the controlled glove box again ensures that finished samples remain clean until a full growth campaign is completed. At this point a full cassette can be removed from the glove box and exchanged for a new cassette in a single load and unload cycle ensuring minimal contamination of the glove box environment.

The existing ex vacuo wafer processing system is a prototype for a fully automated system that will integrate wafer cleaning, surface activation, wafer bonding, thinning, and surface preparation. The components used to construct the processing equipment that we have described for such an automated system, including robotic transfer systems, are commercially available. We believe that they can be adapted to the specific requirements of JPL's integrated MBE apparatus.

Devices

The systems and methods of the invention can be applied to CCD devices, CMOS devices, NMOS devices, photodiodes and photodiode arrays, and silicon solar cells, as well as other devices built in silicon.

Abrupt Doping Profile

In some embodiments, an abrupt profile having a dopant concentration at least $10^{20}$ cm$^{-3}$ and a dopant gradient at least one decade per nm is provided within a silicon device. In other embodiments, the abrupt profile has a dopant concentration at least $10^{21}$ cm$^{-3}$ and a dopant gradient at least one decade per nm.

There can occur suppression of leakage current generation because an abrupt doping profile acts as a tunnel barrier to prevent charge transfer from the surface to the bulk, in addition, suppression of charge trapping at the surface occurs because quantum confinement increases the energy of the ground state such that electrons at the surface can only exist at sufficiently high energies that they are not bound to the surface. This is significant because UV light creates electrons at sufficiently high energy to reach the surface, but such electrons are in an excited state relative to lower-energy bulk states, and there is no bound state at the surface that can effectively trap them.

Computer Control

General purpose programmable computers useful for controlling instrumentation, recording signals and analyzing signals or data according to the present description can be any of a personal computer (PC), a microprocessor based computer, a portable computer, a microcomputer, or other type of processing device. The general purpose programmable computer typically comprises a central processing unit, a storage or memory unit that can record and read information and programs using machine-readable storage media, a communication terminal such as a wired communication device or a wireless communication device, an output device such as a display terminal, and an input device such as a keyboard. The display terminal can be a touch screen display, in which case it can function as both a display device and an input device. Different and/or additional input devices can be present such as a pointing device, such as a mouse or a joystick, and different or additional output devices can be present such as an enunciator, for example a speaker, a second display, or a printer. The computer can run any one of a variety of operating systems, such as for example, any one of several versions of Windows, or of MacOS, or of UNIX, or of Linux. Computational results obtained in the operation of the general purpose computer can be stored for later use, and/or can be displayed to a user. At the very least, each microprocessor-based general purpose computer has registers that store the results of each computational step within the microprocessor, which results are then commonly stored in cache memory for later use.

"Microcomputer" is defined herein as synonymous with microprocessor, microcontroller, and digital signal processor ("DSP"). It is understood that memory used by the microcomputer, including for example instructions for data processing coded as "firmware" can reside in memory physically inside of a microcomputer chip or in memory external to the microcomputer or in a combination of internal and external memory. Similarly, analog signals can be digitized by a standalone analog to digital converter ("ADC") or one or more ADCs or multiplexed ADC channels can reside within a microcomputer package. It is also understood that field programmable array ("FPGA") chips or application specific integrated circuits ("ASIC") chips can perform microcomputer functions, either in hardware logic, software emulation of a microcomputer, or by a combination of the two. Apparatus having any of the inventive features described herein can operate entirely on one microcomputer or can include more than one microcomputer.

Recording the results from an operation or data acquisition, such as for example, recording results at a particular frequency or wavelength, is understood to mean and is defined herein as writing output data in a non-transitory manner to a storage element, to a machine-readable storage medium, or to a storage device. Non-transitory machine-readable storage media that can be used in the invention include electronic, magnetic and/or optical storage media, such as magnetic floppy disks and hard disks; a DVD drive, a CD drive that in some embodiments can employ DVD disks, any of CD-ROM disks (i.e., read-only optical storage disks), CD-R disks (i.e., write-once, read-many optical storage disks), and CD-RW disks (i.e., rewriteable optical storage disks); and electronic storage media, such as RAM, ROM, EPROM, Compact Flash cards, PCMCIA cards, or alternatively SD or SDIO memory; and the electronic components (e.g., floppy disk drive, DVD drive, CD/CD-R/CD-RW drive, or Compact Flash/PCMCIA/SD adapter) that accommodate and read from and/or write to the storage media. Unless otherwise explicitly recited, any reference herein to "record" or "recording" is understood to refer to a non-transitory record or a non-transitory recording.

As is known to those of skill in the machine-readable storage media arts, new media and formats for data storage are continually being devised, and any convenient, commercially available storage medium and corresponding read/write device that may become available in the future is likely to be appropriate for use, especially if it provides any of a greater storage capacity, a higher access speed, a smaller size, and a lower cost per bit of stored information. Recording image data for later use (e.g., writing an image to memory or to digital memory) can be performed to enable the use of the recorded information as output, as data for display to a user, or as data to be made available for later use. Such digital memory elements or chips can be standalone memory devices, or can be incorporated within a device of interest. "Writing output data" or "writing an image to memory" is defined herein as including writing transformed data to registers within a microcomputer.

Theoretical Discussion

Although the theoretical description given herein is thought to be correct, the operation of the devices described and claimed herein does not depend upon the accuracy or validity of the theoretical description. That is, later theoretical developments that may explain the observed results on a basis different from the theory presented herein will not detract from the inventions described herein.

Any patent, patent application, or publication identified in the specification is hereby incorporated by reference herein in its entirety. Any material, or portion thereof, that is said to be incorporated by reference herein, but which conflicts with existing definitions, statements, or other disclosure material explicitly set forth herein is only incorporated to the extent that no conflict arises between that incorporated material and the present disclosure material. In the event of a conflict, the conflict is to be resolved in favor of the present disclosure as the preferred disclosure.

While the present invention has been particularly shown and described with reference to the preferred mode as illustrated in the drawing, it will be understood by one skilled in the art that various changes in detail may be affected therein without departing from the spirit and scope of the invention as defined by the claims.

What is claimed is:

1. A silicon processing method, comprising the steps of:
   providing an MBE apparatus, comprising:
      an epitaxy chamber configured to perform molecular beam epitaxy on a silicon material;
      two preparation chambers, at least one preparation chamber of said two preparation chambers configured to clean a surface of said silicon material of surface contaminants by a process having an impurity removal step, and having an oxide removal step, said at least one preparation chamber having at least one mutual communication port with said epitaxy chamber whereby said silicon material can be transferred between said epitaxy chamber and said at least one preparation chamber; said at least one preparation chamber having in communication therewith a plasma source configured to generate an oxidizing plasma, at least one throttle valve, at least one controller, and at least one reactive gas supply configured to provide reagent gases to said at least one preparation chamber; and pumping equipment configured to provide a reduced pressure within said at least one preparation chamber;
   providing a silicon material to be processed;
   removing an impurity from a surface of said silicon material;
   reacting an oxide present on said surface of said silicon material with reagent gases to form a silicon compound volatile at a temperature below 450° C.; and
   removing said silicon compound to provide a clean hydrogen-bonded silicon surface on said silicon material.

2. The silicon processing method of claim 1, further comprising the step of:
   performing molecular beam epitaxy on said silicon material.

3. The silicon processing method of claim 2, wherein said step of performing molecular beam epitaxy on said silicon material comprises performing delta doping.

4. The silicon processing method of claim 1, wherein said silicon material is maintained at a temperature less than or equal to 450° C.

5. The silicon processing method of claim 1, wherein said silicon material comprises a device selected from the group of devices consisting of a CCD device, a CMOS device, an NMOS device, a photodiode, and a silicon solar cell.

6. The silicon processing method of claim 1, wherein said silicon material comprises a device configured to operate under back-illumination.

7. The silicon processing method of claim 1, wherein said impurity removal step is performed in a first of said two preparation chambers and an oxide removal step is performed in a second of said two preparation chambers.

8. The silicon processing method of claim 1, wherein said impurity removal step and oxide removal step are repeated multiple times.

9. The silicon processing method of claim 1, wherein one of said first and second preparation chambers is a glove box.

10. The silicon processing method of claim 1, wherein said impurity removal step and said oxide removal step are repeated multiple times.

11. The silicon processing method of claim 1 wherein said impurity removal step is an oxidation step.

12. The silicon processing method of claim 11, wherein said oxidation step is performed using a gas comprising oxygen.

13. The silicon processing method of claim 11 wherein said impurity comprises carbon.

14. The silicon processing method of claim 1 wherein said impurity removal step is a reduction step.

15. The silicon processing method of claim 14, wherein said reduction step is performed using a gas selected from the group consisting of $H_2$, $NH_3$, and mixtures thereof.

16. The silicon processing method of claim 14, wherein said impurity comprises carbon.

17. The silicon processing method of claim 1, wherein said oxide removal step is performed using a gas selected from the group consisting of $NF_3$, $NH_3$, $N_2$, $H_2$ and mixtures thereof.

18. The silicon processing method of claim 1, wherein said oxide removal step is performed using a fluorine containing gas.

19. The silicon processing method of claim 18, wherein said fluorine containing gas is selected from the group consisting of HF, $NF_3$, and $F_2$ and mixtures thereof.

* * * * *